(12) United States Patent
Fujimura et al.

(10) Patent No.: US 11,264,206 B2
(45) Date of Patent: *Mar. 1, 2022

(54) METHODS AND SYSTEMS FOR FORMING A PATTERN ON A SURFACE USING MULTI-BEAM CHARGED PARTICLE BEAM LITHOGRAPHY

(71) Applicant: D2S, Inc., San Jose, CA (US)

(72) Inventors: Akira Fujimura, Saratoga, CA (US);
Thang Nguyen, San Jose, CA (US);
Ajay Baranwal, Dublin, CA (US);
Michael J. Meyer, Palo Alto, CA (US);
Suhas Pillai, San Jose, CA (US)

(73) Assignee: D2S, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/655,582

(22) Filed: Oct. 17, 2019

(65) Prior Publication Data

US 2020/0051781 A1 Feb. 13, 2020

Related U.S. Application Data

(63) Continuation-in-part of application No. 16/380,890, filed on Apr. 10, 2019, which is a continuation of (Continued)

(51) Int. Cl.
*H01J 37/317* (2006.01)
*G06N 3/00* (2006.01)
(Continued)

(52) U.S. Cl.
CPC .......... *H01J 37/3175* (2013.01); *G06N 3/008* (2013.01); *G06N 3/04* (2013.01);
(Continued)

(58) Field of Classification Search
CPC .............. H01J 37/3175; H01J 37/3177; H01J 2237/30416; H01J 2237/31761;
(Continued)

(56) References Cited

U.S. PATENT DOCUMENTS 6,014,200 A 1/2000 Sogard et al.
7,981,575 B2 7/2011 Fujimura et al.
(Continued)

FOREIGN PATENT DOCUMENTS

TW 200603235 A 1/2006
TW 201306110 A 2/2013

OTHER PUBLICATIONS

Office Action dated Feb. 17, 2021 for U.S. Appl. No. 16/380,890.
(Continued)

*Primary Examiner* — Brooke Purinton
(74) *Attorney, Agent, or Firm* — MLO, a professional corp.

(57) ABSTRACT

Methods for fracturing or mask data preparation are disclosed in which a set of single-beam charged particle beam shots is input; a calculated image is calculated using a neural network, from the set of single-beam charged particle beam shots; and a set of multi-beam shots is generated based on the calculated image, to convert the set of single-beam charged particle beam shots to the set of multi-beam shots which will produce a surface image on the surface. Methods for training a neural network include inputting a set of single-beam charged particle beam shots; calculating a set of calculated images using the set of single-beam charged particle beam shots; and training the neural network with the set of calculated images.

14 Claims, 18 Drawing Sheets

Related U.S. Application Data application No. 14/642,755, filed on Mar. 10, 2015, now Pat. No. 10,290,467.

(60) Provisional application No. 61/950,353, filed on Mar. 10, 2014.

(51) Int. Cl.
  *G06N 3/10* (2006.01)
  *G06N 3/08* (2006.01)
  *G06N 3/04* (2006.01)

(52) U.S. Cl.
  CPC .............. *G06N 3/08* (2013.01); *G06N 3/10* (2013.01); *G06T 2207/20081* (2013.01); *G06T 2207/20084* (2013.01); *H01J 37/3177* (2013.01)

(58) Field of Classification Search
  CPC .......... G06N 3/04; G06N 3/08; G06N 3/008; G06N 3/10; G06T 2207/20084; G06T 2207/20081
  See application file for complete search history.

(56) References Cited

U.S. PATENT DOCUMENTS

| | | | |
|---|---|---|---|
| 8,938,696 B1* | 1/2015 | Torunoglu | G06F 30/39 |
| | | | 716/53 |
| 10,290,467 B2* | 5/2019 | Fujimura | H01J 37/3175 |
| 10,923,318 B2* | 2/2021 | Gledhill | G06N 3/0454 |
| 2011/0159434 A1 | 6/2011 | Zable et al. | |
| 2011/0226968 A1 | 9/2011 | Platzgummer | |
| 2012/0047474 A1 | 2/2012 | Choi et al. | |
| 2012/0091318 A1 | 4/2012 | Wieland et al. | |
| 2012/0151428 A1 | 6/2012 | Tanaka et al. | |
| 2013/0120724 A1 | 5/2013 | Wieland et al. | |
| 2013/0283219 A1 | 10/2013 | Fujimura et al. | |
| 2015/0254393 A1* | 9/2015 | Fujimura | H01J 37/3026 |
| | | | 250/492.22 |
| 2020/0018944 A1* | 1/2020 | Fang | G06N 3/0454 |
| 2020/0025696 A1* | 1/2020 | Potocek | G06T 7/11 |

OTHER PUBLICATIONS

International Search Report and Written Opinion dated Jun. 3, 2015 for PCT Patent Application No. PCT/US2015/019545.
Office Action dated Jun. 29, 2017 for U.S. Appl. No. 14/642,755.
Office Action dated Jun. 6, 2018 for Taiwan Patent Application No. 104107425.
Office Action dated Nov. 25, 2016 for U.S. Appl. No. 14/642,755.
Olaf Ronneberger, et al., "U-Net: Convolutional Networks for Biomedical Image Segmentation," BIOSS Centre for Biological Signally Studies, University of Freiburg, Germany, May 18, 2015, https://arxiv.org/abs/1505.04597.

* cited by examiner

METHODS AND SYSTEMS FOR FORMING A PATTERN ON A SURFACE USING MULTI-BEAM CHARGED PARTICLE BEAM LITHOGRAPHY

RELATED APPLICATIONS

This application is a continuation-in-part of U.S. patent application Ser. No. 16/380,890 filed on Apr. 10, 2019 and entitled "Method and System for Forming a Pattern on a Surface Using Multi-Beam Charged Particle Beam Lithography"; which is a continuation of U.S. patent application Ser. No. 14/642,755 filed on Mar. 10, 2015, entitled "Method and System For Forming a Pattern On a Surface Using Multi-Beam Charged Particle Beam Lithography" and issued as U.S. Pat. No. 10,290,467; which claims priority to U.S. Provisional Patent Application Ser. No. 61/950,353 filed on Mar. 10, 2014 and entitled "Method and System For Forming a Pattern On a Surface Using Multi-Beam Charged Particle Beam Lithography"; all of which are hereby incorporated by reference for all purposes.

BACKGROUND OF THE DISCLOSURE

In the production or manufacturing of semiconductor devices, such as integrated circuits, optical lithography may be used to fabricate the semiconductor devices. Optical lithography is a printing process in which a lithographic mask or photomask manufactured from a reticle is used to transfer patterns to a substrate such as a semiconductor or silicon wafer to create the integrated circuit (I.C.). Other substrates could include flat panel displays, holographic masks, or even other reticles. While conventional optical lithography uses a light source having a wavelength of 193 nm, extreme ultraviolet (EUV) or X-ray lithography are also considered types of optical lithography in this application. The reticle or multiple reticles may contain a circuit pattern corresponding to an individual layer of the integrated circuit, and this pattern can be imaged onto a certain area on the substrate that has been coated with a layer of radiation-sensitive material known as photoresist or resist. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Eventually, a combination of multiples of devices or integrated circuits will be present on the substrate. These integrated circuits may then be separated from one another by dicing or sawing and then may be mounted into individual packages. In the more general case, the patterns on the substrate may be used to define artifacts such as display pixels, holograms, directed self-assembly (DSA) guard bands, or magnetic recording heads. Conventional optical lithography writing machines typically reduce the photomask pattern by a factor of four during the optical lithographic process. Therefore, patterns formed on the reticle or mask must be four times larger than the size of the desired pattern on the substrate or wafer.

In the production or manufacturing of semiconductor devices, such as integrated circuits, non-optical methods may be used to transfer a pattern on a lithographic mask to a substrate such as a silicon wafer. Nanoimprint lithography (NIL) is an example of a non-optical lithography process. In nanoimprint lithography, a lithographic mask pattern is transferred to a surface through contact of the lithography mask with the surface.

Two common types of charged particle beam lithography are variable shaped beam (VSB) and character projection (CP). These are both sub-categories of shaped beam charged particle beam lithography, in which a precise electron beam is shaped and steered so as to expose a resist-coated surface, such as the surface of a wafer or the surface of a reticle. In VSB, these shapes are simple shapes, usually limited to rectangles of certain minimum and maximum sizes and with sides which are parallel to the axes of a Cartesian coordinate plane (i.e. of "Manhattan" orientation), and 45 degree right triangles (i.e. triangles with their three internal angles being 45 degrees, 45 degrees, and 90 degrees) of certain minimum and maximum sizes. At predetermined locations, doses of electrons are shot into the resist with these simple shapes. The total writing time for this type of system increases with the number of shots. In character projection (CP), there is a stencil in the system that has in it a variety of apertures or characters which may be complex shapes such as rectilinear, arbitrary-angled linear, circular, nearly circular, annular, nearly annular, oval, nearly oval, partially circular, partially nearly circular, partially annular, partially nearly annular, partially nearly oval, or arbitrary curvilinear shapes, and which may be a connected set of complex shapes or a group of disjointed sets of a connected set of complex shapes. An electron beam can be shot through a character on the stencil to efficiently produce more complex patterns on the reticle. In theory, such a system can be faster than a VSB system because it can shoot more complex shapes with each time-consuming shot. Thus, an E-shaped pattern shot with a VSB system takes four shots, but the same E-shaped pattern can be shot with one shot with a character projection system. Note that VSB systems can be thought of as a special (simple) case of character projection, where the characters are just simple characters, usually rectangles or 45-45-90 degree triangles. It is also possible to partially expose a character. This can be done by, for instance, blocking part of the particle beam. For example, the E-shaped pattern described above can be partially exposed as an F-shaped pattern or an I-shaped pattern, where different parts of the beam are cut off by an aperture. This is the same mechanism as how various sized rectangles can be shot using VSB. In this disclosure, partial projection is used to mean both character projection and VSB projection. Shaped beam charged particle beam lithography may use either a single shaped beam, or may use a plurality of shaped beams simultaneously exposing the surface, the plurality of shaped beams producing a higher writing speed than a single shaped beam.

As indicated, in lithography the lithographic mask or reticle comprises geometric patterns corresponding to the circuit components to be integrated onto a substrate. The patterns used to manufacture the reticle may be generated utilizing computer-aided design (CAD) software or programs. In designing the patterns the CAD program may follow a set of pre-determined design rules in order to create the reticle. These rules are set by processing, design, and end-use limitations. An example of an end-use limitation is defining the geometry of a transistor in a way in which it cannot sufficiently operate at the required supply voltage. In particular, design rules can define the space tolerance between circuit devices or interconnect lines. The design rules are, for example, used to ensure that the circuit devices or lines do not interact with one another in an undesirable manner. For example, the design rules are used so that lines do not get too close to each other in a way that may cause a short circuit. The design rule limitations reflect, among other things, the smallest dimensions that can be reliably fabricated. When referring to these small dimensions, one usually introduces the concept of a critical dimension. These are, for instance, defined as the smallest width of a line or the smallest space between two lines, those dimensions requiring exquisite control.

One goal in integrated circuit fabrication by optical lithography is to reproduce the original circuit design on the substrate by use of the reticle. Integrated circuit fabricators are always attempting to use the semiconductor wafer real estate as efficiently as possible. Engineers keep shrinking the size of the circuits to allow the integrated circuits to contain more circuit elements and to use less power. As the size of an integrated circuit critical dimension is reduced and its circuit density increases, the critical dimension of the circuit pattern or physical design approaches the resolution limit of the optical exposure tool used in conventional optical lithography. As the critical dimensions of the circuit pattern become smaller and approach the resolution value of the exposure tool, the accurate transcription of the physical design to the actual circuit pattern developed on the resist layer becomes difficult. To further the use of optical lithography to transfer patterns having features that are smaller than the light wavelength used in the optical lithography process, a process known as optical proximity correction (OPC) has been developed. OPC alters the physical design to compensate for distortions caused by effects such as optical diffraction and the optical interaction of features with proximate features. OPC includes all resolution enhancement technologies performed with a reticle.

OPC may add sub-resolution lithographic features to mask patterns to reduce differences between the original physical design pattern, that is, the design, and the final transferred circuit pattern on the substrate. The sub-resolution lithographic features interact with the original patterns in the physical design and with each other and compensate for proximity effects to improve the final transferred circuit pattern. One feature that is used to improve the transfer of the pattern is a sub-resolution assist feature (SRAF). Another feature that is added to improve pattern transference is referred to as "serifs." Serifs are small features that can be positioned on an interior or exterior corner of a pattern to sharpen the corner in the final transferred image. It is often the case that the precision demanded of the surface manufacturing process for SRAFs is less than the precision demanded for patterns that are intended to print on the substrate, often referred to as main features. Serifs are a part of a main feature. As the limits of optical lithography are being extended far into the sub-wavelength regime, the OPC features must be made more and more complex in order to compensate for even more subtle interactions and effects. As imaging systems are pushed closer to their limits, the ability to produce reticles with sufficiently fine OPC features becomes critical. Although adding serifs or other OPC features to a mask pattern is advantageous, it also substantially increases the total feature count in the mask pattern. For example, adding a serif to each of the corners of a square using conventional techniques adds eight more rectangles to a mask or reticle pattern. Adding OPC features is a very laborious task, requires costly computation time, and results in more expensive reticles. Not only are OPC patterns complex, but since optical proximity effects are long range compared to minimum line and space dimensions, the correct OPC patterns in a given location depend significantly on what other geometry is in the neighborhood. Thus, for instance, a line end will have different size serifs depending on what is near it on the reticle. This is even though the objective might be to produce exactly the same shape on the wafer. These slight but critical variations are important and have prevented others from being able to form reticle patterns. It is conventional to discuss the OPC-decorated patterns to be written on a reticle in terms of main features, that is features that reflect the design before OPC decoration, and OPC features, where OPC features might include serifs, jogs, and SRAF. To quantify what is meant by slight variations, a typical slight variation in OPC decoration from neighborhood to neighborhood might be 5% to 80% of a main feature size. Note that for clarity, variations in the design of the OPC are what is being referenced. Manufacturing variations such as corner rounding will also be present in the actual surface patterns. When these OPC variations produce substantially the same patterns on the wafer, what is meant is that the geometry on the wafer is targeted to be the same within a specified error, which depends on the details of the function that that geometry is designed to perform, e.g., a transistor or a wire. Nevertheless, typical specifications are in the 2%-50% of a main feature range. There are numerous manufacturing factors that also cause variations, but the OPC component of that overall error is often in the range listed. OPC shapes such as sub-resolution assist features are subject to various design rules, such as a rule based on the size of the smallest feature that can be transferred to the wafer using optical lithography. Other design rules may come from the mask manufacturing process or, if a character projection charged particle beam writing system is used to form the pattern on a reticle, from the stencil manufacturing process. It should also be noted that the accuracy requirement of the SRAF features on the mask may be lower than the accuracy requirements for the main features on the mask. As process nodes continue to shrink, the size of the smallest SRAFs on a photomask also shrinks. For example, at the 20 nm logic process node, 40 nm to 60 nm SRAFs are needed on the mask for the highest precision layers.

Inverse lithography technology (ILT) is one type of OPC technique. ILT is a process in which a pattern to be formed on a reticle is directly computed from a pattern which is desired to be formed on a substrate such as a silicon wafer. This may include simulating the optical lithography process in the reverse direction, using the desired pattern on the substrate as input. ILT-computed reticle patterns may be purely curvilinear—i.e. completely non-rectilinear—and may include circular, nearly circular, annular, nearly annular, oval and/or nearly oval patterns. Since these ideal ILT curvilinear patterns are difficult and expensive to form on a reticle using conventional techniques, rectilinear approximations or rectilinearizations of the curvilinear patterns may be used. The rectilinear approximations decrease accuracy, however, compared to the ideal ILT curvilinear patterns. Additionally, if the rectilinear approximations are produced from the ideal ILT curvilinear patterns, the overall calculation time is increased compared to ideal ILT curvilinear patterns. In this disclosure ILT, OPC, source mask optimization (SMO), and computational lithography are terms that are used interchangeably.

EUV optical lithography has a much higher resolution than conventional optical lithography. The very high resolution of EUV significantly reduces the need for OPC processing, resulting in lower mask complexity for EUV than for 193 nm optical lithography. However, because of the very high resolution of EUV, imperfections in a photomask, such as excessive line edge roughness (LER), will be transferred to the wafer. Therefore, the accuracy requirements for EUV masks are higher than those for conventional optical lithography. Additionally, even though EUV mask shapes are not complicated by the addition of complex SRAFs or serifs required for conventional 193 nm lithography, EUV mask shapes are complicated by an addition of some complexities unique to EUV manufacturing. Of particular relevance in writing patterns on masks for EUV lithography is mid-range scattering of charged particles such as electrons, which may affect a radius of about 2 um. This midrange scattering introduces a new consideration for mask data preparation, because for the first time the influence from neighboring patterns has significant impact on the shape that a particular pattern would cast onto the mask surface. Previously, when exposing masks for use with conventional 193 nm lithography, the short-range scattering affected only the pattern being written, and the long-range scattering had a large enough effective range that only the size of a pattern, and not its detailed shape, was affected, making it possible to make corrections by only using dose modulation. In addition, since EUV processing of wafers is more expensive, it is desirable to reduce or eliminate multiple patterning. Multiple patterning is used in conventional optical lithography to allow exposure of small features by exposing patterns for one layer of wafer processing using multiple masks, each of which contains a portion of the layer pattern. Reducing or eliminating multiple exposures requires the single mask to contain more fine patterns. For example, a series of collinear line segments maybe double-patterned by first drawing a long line, then cutting the line into line segments by a second mask in conventional lithography. The same layer written with a single mask, such as for EUV lithography, would require a mask containing many smaller line segments. The need to write larger numbers of finer patterns on a single mask, each pattern needing to be more accurate, increases the need for precision on EUV masks.

There are a number of technologies used for forming patterns on a reticle, including using optical lithography or charged particle beam lithography. The most commonly used system is the variable shaped beam (VSB), where, as described above, doses of electrons with simple shapes such as Manhattan rectangles and 45-degree right triangles expose a resist-coated reticle surface. In conventional mask writing, the doses or shots of electrons are designed to avoid overlap wherever possible, so as to greatly simplify calculation of how the resist on the reticle will register the pattern. Similarly, the set of shots is designed so as to completely cover the pattern area that is to be formed on the reticle. U.S. Pat. No. 7,754,401, owned by the assignee of the present patent application and incorporated by reference for all purposes, discloses a method of mask writing in which intentional shot overlap for writing patterns is used. When overlapping shots are used, charged particle beam simulation can be used to determine the pattern that the resist on the reticle will register. Use of overlapping shots may allow patterns to be written with reduced shot count or higher accuracy or both. U.S. Pat. No. 7,754,401 also discloses use of dose modulation, where the assigned dosages of shots vary with respect to the dosages of other shots. The term model-based fracturing is used to describe the process of determining shots using the techniques of U.S. Pat. No. 7,754,401.

Reticle writing for the most advanced technology nodes typically involves multiple passes of charged particle beam writing, a process called multi-pass exposure, whereby the given shape on the reticle is written and overwritten. Typically, two to four passes are used to write a reticle to average out precision errors in the charged particle beam writer, allowing the creation of more accurate photomasks. Also typically, the list of shots, including the dosages, is the same for every pass. In one variation of multi-pass exposure, the lists of shots may vary among exposure passes, but the union of the shots in any exposure pass covers the same area. Multi-pass writing can reduce over-heating of the resist coating the surface. Multi-pass writing also averages out random errors of the charged particle beam writer. Multi-pass writing using different shot lists for different exposure passes can also reduce the effects of certain systemic errors in the writing process.

Current optical lithography writing machines typically reduce the photomask pattern by a factor of four during the optical lithographic process. Therefore, patterns formed on a reticle or mask must be four times larger than the size of the desired pattern on the substrate or wafer.

SUMMARY OF THE DISCLOSURE

A method for fracturing or mask data preparation of a pattern to be formed on a surface using multi-beam charged particle beam lithography is disclosed. The method includes inputting a set of single-beam charged particle beam shots, and calculating a calculated image using the set of single-beam charged particle beam shots, where the calculating comprises using a neural network. The method also includes generating a set of multi-beam shots based on the calculated image, to convert the set of single-beam charged particle beam shots to the set of multi-beam shots which will produce a surface image on the surface, where the surface image matches the calculated image, within a pre-determined tolerance, and where the generating is performed using a computing hardware processor.

A method for training a neural network is also disclosed, which includes inputting a set of single-beam charged particle beam shots; calculating a set of calculated images using the set of single-beam charged particle beam shots; and training the neural network with the set of calculated images, where the training is performed using a computing hardware processor.

DETAILED DESCRIPTION OF THE EMBODIMENTS

The present disclosure is related to lithography, and more particularly to the design and manufacture of a surface which may be a reticle, a wafer, or any other surface, using charged particle beam lithography.

Figure 1:
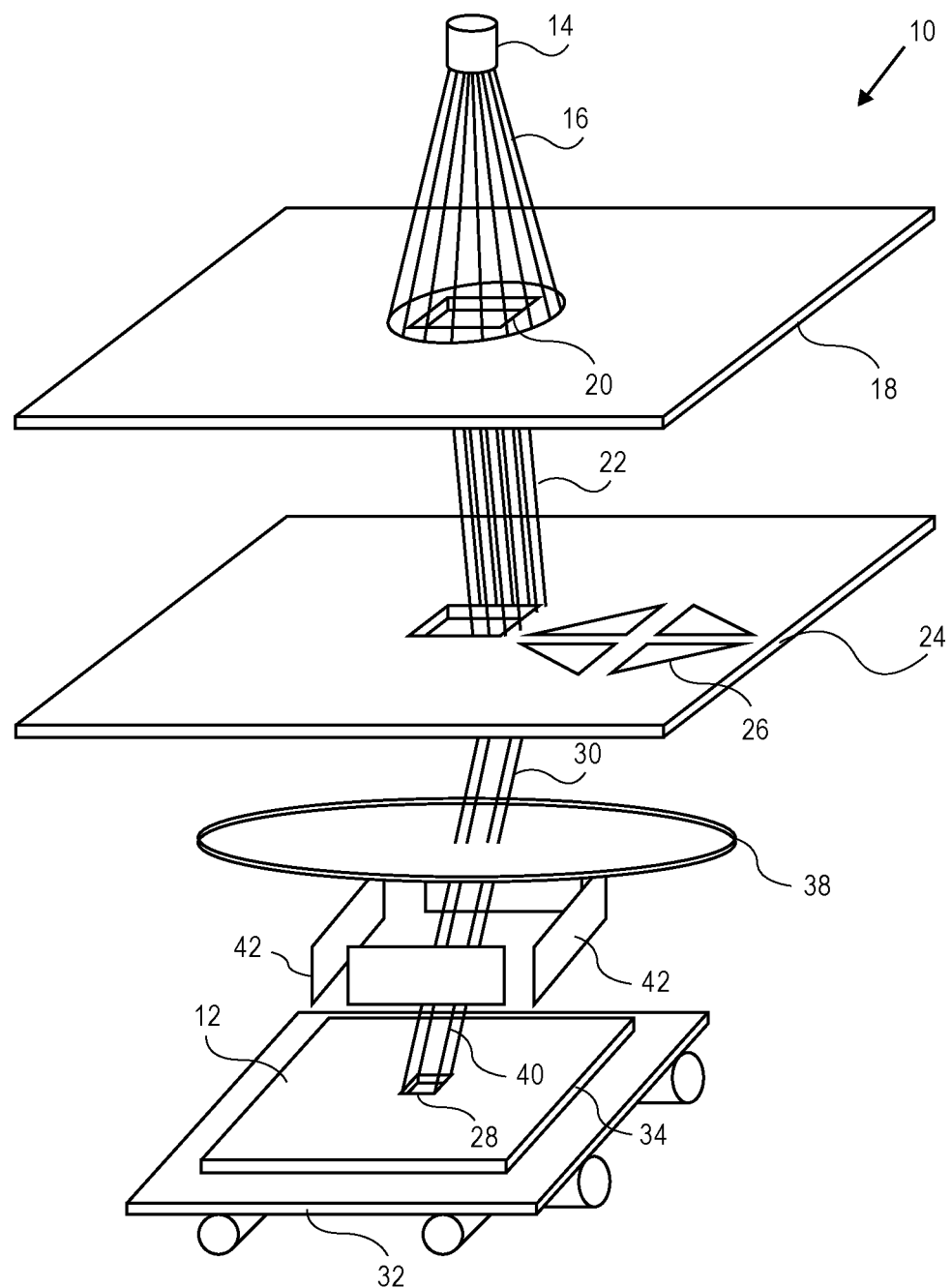
FIG. 1 illustrates an example of a charged particle beam system.

Referring now to the drawings, wherein like numbers refer to like items, FIG. 1 illustrates an embodiment of a lithography system, such as a charged particle beam writer system, in this case an electron beam writer system 10, that employs a variable shaped beam (VSB) to manufacture a surface 12. The electron beam writer system 10 has an electron beam source 14 that projects an electron beam 16 toward an aperture plate 18. The plate 18 has an aperture 20 formed therein which allows the electron beam 16 to pass. Once the electron beam 16 passes through the aperture 20 it is directed or deflected by a system of lenses (not shown) as electron beam 22 toward another rectangular aperture plate or stencil mask 24. The stencil 24 has formed therein a number of openings or apertures 26 that define various simple shapes such as rectangles and triangles. Each aperture 26 formed in the stencil 24 may be used to form a pattern in the surface 12 of a substrate 34, such as a silicon wafer, a reticle or other substrate. An electron beam 30 emerges from one of the apertures 26 and passes through an electromagnetic or electrostatic reduction lens 38, which reduces the size of the pattern emerging from the aperture 26. In commonly available charged particle beam writer systems, the reduction factor is between 10 and 60. The reduced electron beam 40 emerges from the reduction lens 38 and is directed by a series of deflectors 42 onto the surface 12 as a pattern 28. The surface 12 is coated with resist (not shown) which reacts with the electron beam 40. The electron beam 22 may be directed to overlap a variable portion of an aperture 26, affecting the size and shape of the pattern 28. Blanking plates (not shown) are used to deflect the beam 16 or the shaped beam 22 so to prevent the electron beam from reaching the surface 12 during a period after each shot when the lenses directing the beam 22 and the deflectors 42 are being re-adjusted for the succeeding shot. Typically the blanking plates are positioned so as to deflect the electron beam 16 to prevent it from illuminating aperture 20. Conventionally, the blanking period may be a fixed length of time, or it may vary depending, for example, on how much the deflector 42 must be re-adjusted for the position of the succeeding shot.

In electron beam writer system 10, the substrate 34 is mounted on a movable platform or stage 32. The stage 32 allows substrate 34 to be repositioned so that patterns which are larger than the maximum deflection capability or field size of the charged particle beam 40 may be written to surface 12 in a series of subfields, where each subfield is within the capability of deflector 42 to deflect the beam 40. In one embodiment the substrate 34 may be a reticle. In this embodiment, the reticle, after being exposed with the pattern, undergoes various manufacturing steps through which it becomes a lithographic mask or photomask. The mask may then be used in an optical lithography machine to project an image of the reticle pattern 28, generally reduced in size, onto a silicon wafer to produce an integrated circuit. More generally, the mask is used in another device or machine to transfer the pattern 28 on to a substrate (not illustrated).

Figure 2:
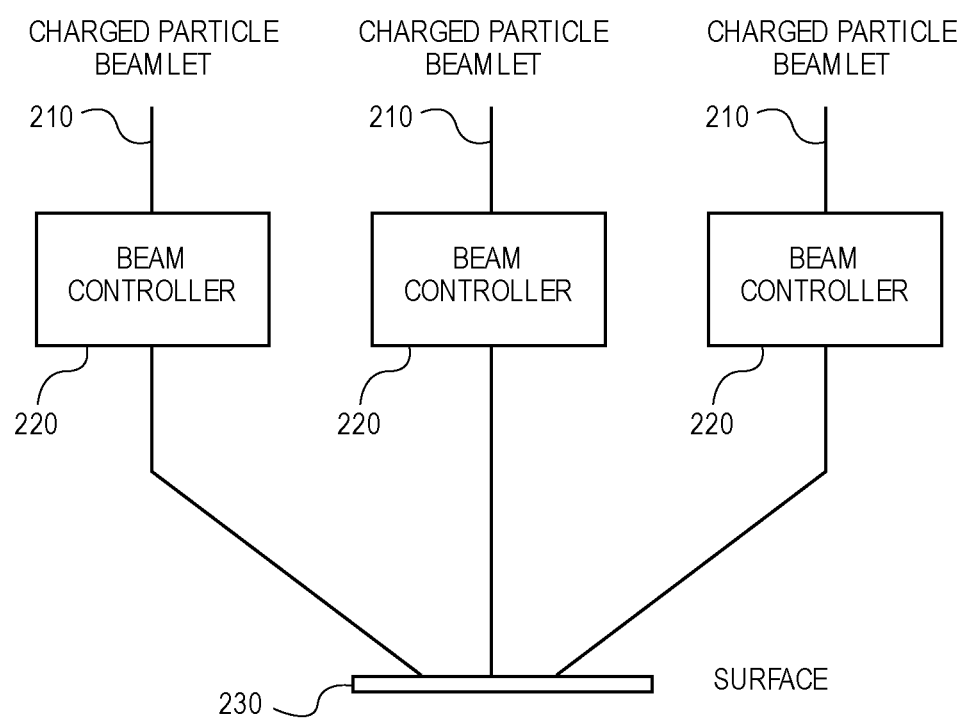
FIG. 2 illustrates an example of an electro-optical schematic diagram of a multi-beam exposure system.

A charged particle beam system may expose a surface with a plurality of individually-controllable beams or beamlets. FIG. 2 illustrates an electro-optical schematic diagram in which there are three charged particle beamlets 210. Associated with each beamlet 210 is a beam controller 220. Each beam controller 220 can, for example, allow its associated beamlet 210 to strike surface 230, and can also prevent beamlet 210 from striking the surface 230. In some embodiments, beam controller 220 may also control beam blur, magnification, size and/or shape of beamlet 210. In this disclosure, a charged particle beam system which has a plurality of individually-controllable beamlets is called a multi-beam system. In some embodiments, charged particles from a single source may be sub-divided to form a plurality of beamlets 210. In other embodiments a plurality of sources may be used to create the plurality of beamlets 210. In some embodiments, beamlets 210 may be shaped by one or more apertures, whereas in other embodiments there may be no apertures to shape the beamlets. Each beam controller 220 may allow the period of exposure of its associated beamlet to be controlled individually. Generally the beamlets will be reduced in size by one or more lenses (not shown) before striking the surface 230, which will typically be coated with a resist. In some embodiments each beamlet may have a separate electro-optical lens, while in other embodiments a plurality of beamlets, including possibly all beamlets, will share an electro-optical lens.

Figure 3A:
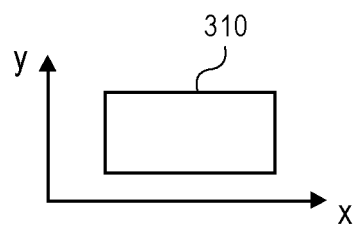
FIG. 3A illustrates an example of a rectangular shot.
Figure 3B:
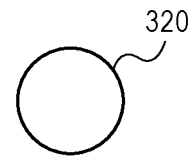
FIG. 3B illustrates an example of a circular character projection shot.
Figure 3C:
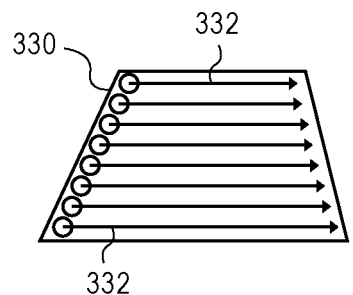
FIG. 3C illustrates an example of a trapezoidal shot.
Figure 3D:
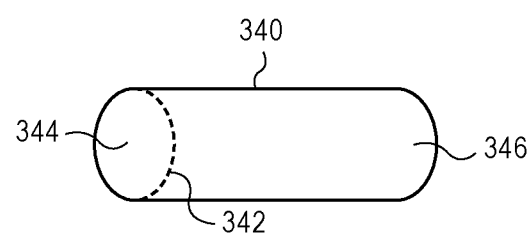
FIG. 3D illustrates an example of a dragged shot.

For purposes of this disclosure, a shot is the exposure of some surface area over a period of time. The area may be comprised of multiple discontinuous smaller areas. A shot may be comprised of a plurality of other shots which may or may not overlap, and which may or may not be exposed simultaneously. A shot may comprise a specified dose, or the dose may be unspecified. Shots may use a shaped beam, an unshaped beam, or a combination of shaped and unshaped beams. FIG. 3 illustrates some various types of shots. FIG. 3A illustrates an example of a rectangular shot 310. A VSB charged particle beam system can, for example, form rectangular shots in a variety of x and y dimensions. FIG. 3B illustrates an example of a character projection (CP) shot 320, which is circular in this example. FIG. 3C illustrates an example of a trapezoidal shot 330. In one embodiment, shot 330 may be a created using a raster-scanned charged particle beam, where the beam is scanned, for example, in the x-direction as illustrated with scan lines 332. FIG. 3D illustrates an example of a dragged shot 340, disclosed in U.S. Patent Application Publication 2011-0089345. Shot 340 is formed by exposing the surface with a curvilinear shaped beam 342 at an initial reference position 344, and then moving the shaped beam across the surface from position 344 to position 346. A dragged shot path may be, for example, linear, piecewise linear, or curvilinear.

Figure 3E:
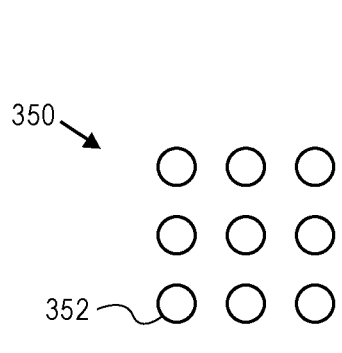
FIG. 3E illustrates an example of a shot which is an array of circular patterns.
Figure 3F:
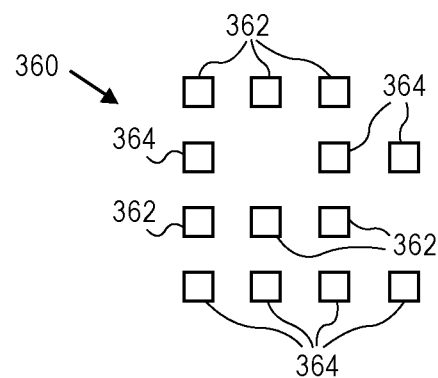
FIG. 3F illustrates an example of a shot which is a sparse array of rectangular patterns.

FIG. 3E illustrates an example of a shot 350 that is an array of circular patterns 352. Shot 350 may be formed in a variety of ways, including multiple shots of a single circular CP character, one or more shots of a CP character which is an array of circular apertures, and one or more multi-beam shots using circular apertures. FIG. 3F illustrates an example of a shot 360 that is a sparse array of rectangular patterns 362 and 364. Shot 360 may be formed in a variety of ways, including a plurality of VSB shots, a CP shot, and one or more multi-beam shots using rectangular apertures. In some embodiments of multi-beam, shot 360 may comprise a plurality of interleaved groups of other multi-beam shots. For example, patterns 362 may be shot simultaneously, then patterns 364 may be shot simultaneously at a time different from patterns 362.

Figure 4:
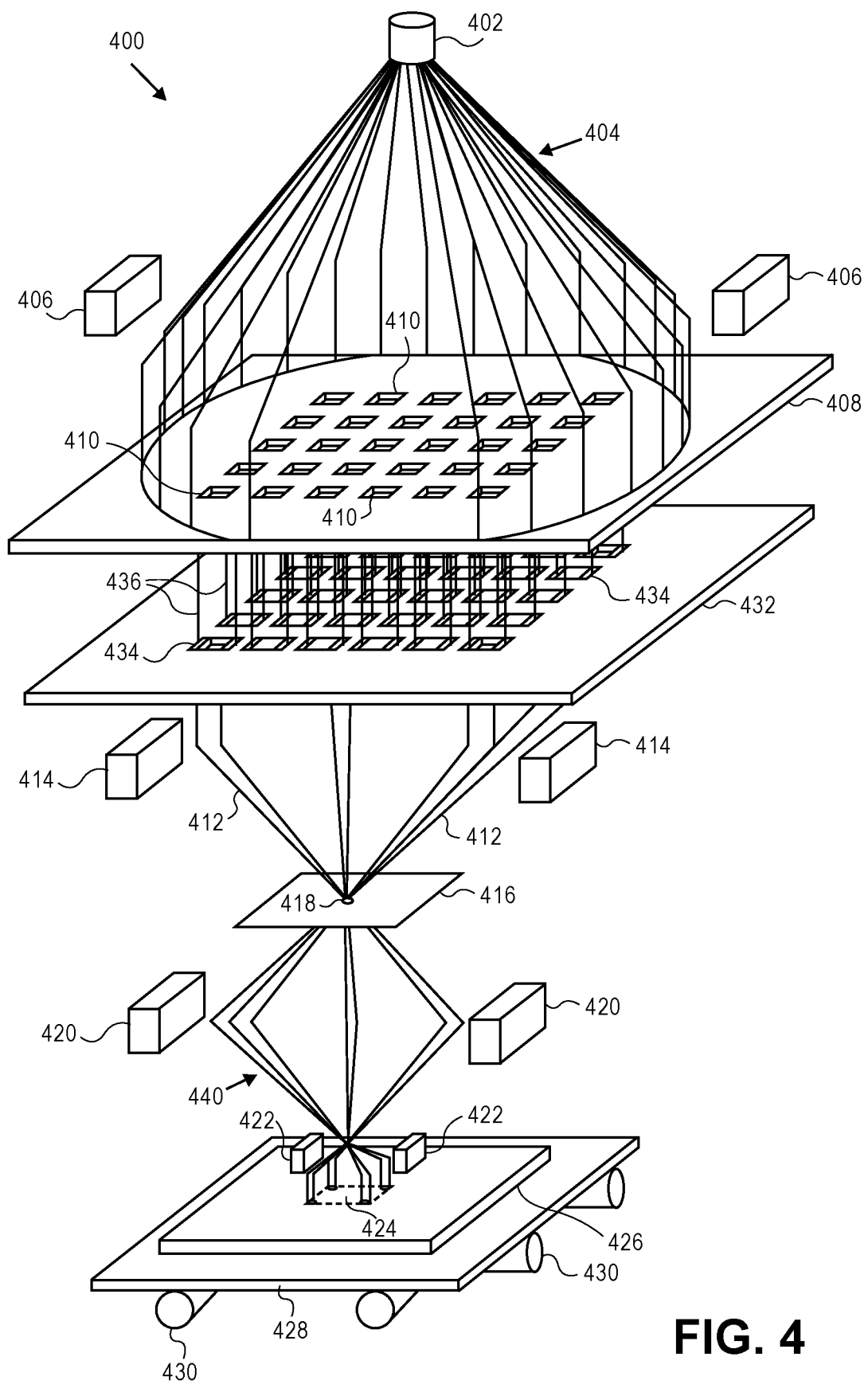
FIG. 4 illustrates an example of a multi-beam charged particle beam system.

FIG. 4 illustrates an embodiment of a charged particle beam exposure system 400. Charged particle beam system 400 is a multi-beam system, in which a plurality of individually-controllable shaped beams can simultaneously expose a surface. Multi-beam system 400 has an electron beam source 402 that creates an electron beam 404. The electron beam 404 is directed toward aperture plate 408 by condenser 406, which may include electrostatic and/or magnetic elements. Aperture plate 408 has a plurality of apertures 410 which are illuminated by electron beam 404, and through which electron beam 404 passes to form a plurality of shaped beamlets 436. In some embodiments, aperture plate 408 may have hundreds or thousands of apertures 410. Although FIG. 4 illustrates an embodiment with a single electron beam source 402, in other embodiments apertures 410 may be illuminated by electrons from a plurality of electron beam sources. Apertures 410 may be rectangular, or may be of a different shape, for example circular. The set of beamlets 436 then illuminates a blanking controller plate 432. The blanking controller plate 432 has a plurality of blanking controllers 434, each of which is aligned with a beamlet 436. Each blanking controller 434 can individually control its associated beamlet 436, so as to either allow the beamlet 436 to strike surface 424, or to prevent the beamlet 436 from striking the surface 424. The amount of time for which the beam strikes the surface controls the total energy or "dose" applied by that beamlet. Therefore, the dose of each beamlet may be independently controlled.

In FIG. 4 beamlets that are allowed to strike surface 424 are illustrated as beamlets 412. In one embodiment, the blanking controller 434 prevents its beamlet 436 from striking the surface 424 by deflecting beamlet 436 so that it is stopped by an aperture plate 416 which contains an aperture 418. In some embodiments, blanking plate 432 may be directly adjacent to aperture plate 408. In other embodiments, the relative locations of aperture plate 408 and blanking controller 432 may be reversed from the position illustrated in FIG. 4, so that beam 404 strikes the plurality of blanking controllers 434. A system of lenses comprising elements 414, 420, and 422 allows projection of the plurality of beamlets 412 onto surface 424 of substrate 426, typically at a reduced size compared to the plurality of apertures 410. The reduced-size beamlets form a beamlet group 440 which strikes the surface 424 to form a pattern that matches a pattern of a subset of apertures 410, the subset being those apertures 410 for which corresponding blanking controllers 434 allow beamlets 436 to strike surface 424. In FIG. 4, beamlet group 440 has four beamlets illustrated for forming a pattern on surface 424.

Substrate 426 is positioned on movable platform or stage 428, which can be repositioned using actuators 430. By moving stage 428, beam 440 can expose an area larger than the dimensions of the maximum size pattern formed by beamlet group 440, using a plurality of exposures or shots. In some embodiments, the stage 428 remains stationary during an exposure, and is then repositioned for a subsequent exposure. In other embodiments, stage 428 moves continuously and at a variable velocity. In yet other embodiments, stage 428 moves continuously but at a constant velocity, which can increase the accuracy of the stage positioning. For those embodiments in which stage 428 moves continuously, a set of deflectors (not shown) may be used to move the beam to match the direction and velocity of stage 428, allowing the beamlet group 440 to remain stationary with respect to surface 424 during an exposure. In still other embodiments of multi-beam systems, individual beamlets in a beamlet group may be deflected across surface 424 independently from other beamlets in the beamlet group. In some embodiments, stage 428 may be moved in a single direction across the entire area of exposure, to expose a portion of the entire area, the portion being called a stripe. The entire area of exposure is therefore exposed as a plurality of stripes. In some embodiments, stage 428 moves in opposite directions on adjacent or alternate stripes.

Other types of multi-beam systems may create a plurality of unshaped beamlets 436, such as by using a plurality of charged particle beam sources to create an array of Gaussian beamlets.

Referring again for FIG. 1, the minimum size pattern that can be projected with reasonable accuracy onto a surface 12 is limited by a variety of short-range physical effects associated with the electron beam writer system 10 and with the surface 12, which normally comprises a resist coating on the substrate 34. These effects include forward scattering, Coulomb effect, and resist diffusion. Beam blur, also called $\beta_f$, is a term used to include all of these short-range effects. The most modern electron beam writer systems can achieve an effective beam blur radius or $\beta_f$ in the range of 20 nm to 30 nm. Forward scattering may constitute one quarter to one half of the total beam blur. Modern electron beam writer systems contain numerous mechanisms to reduce each of the constituent pieces of beam blur to a minimum. Since some components of beam blur are a function of the calibration level of a particle beam writer, the $\beta_f$ of two particle beam writers of the same design may differ. The diffusion characteristics of resists may also vary. Variation of $\beta_f$ based on shot size or shot dose can be simulated and systemically accounted for. But there are other effects that cannot or are not accounted for, and they appear as random variation.

The shot dosage of a charged particle beam writer such as an electron beam writer system is a function of the intensity of the beam source 14 and the exposure time for each shot. Typically the beam intensity remains fixed, and the exposure time is varied to obtain variable shot dosages. Different areas in a shot may have different exposure times, such as in a multi-beam shot. The exposure time may be varied to compensate for various long-range effects such as backscatter, fogging, and loading effects in a process called proximity effect correction (PEC). Electron beam writer systems usually allow setting an overall dosage, called a base dosage, which affects all shots in an exposure pass. Some electron beam writer systems perform dosage compensation calculations within the electron beam writer system itself, and do not allow the dosage of each shot to be assigned individually as part of the input shot list, the input shots therefore having unassigned shot dosages. In such electron beam writer systems all shots have the base dosage, before PEC. Other electron beam writer systems do allow dosage assignment on a shot-by-shot basis. In electron beam writer systems that allow shot-by-shot dosage assignment, the number of available dosage levels may be 64 to 4096 or more, or there may be a relatively few available dosage levels, such as 3 to 8 levels.

The mechanisms within electron beam writers have a relatively coarse resolution for calculations. As such, mid-range corrections such as may be required for EUV masks in the range of 2 µm cannot be computed accurately by current electron beam writers.

In exposing, for example, a repeated pattern on a surface using charged particle beam lithography, the size of each pattern instance, as measured on the final manufactured surface, will be slightly different, due to manufacturing variations. The amount of the size variation is an essential manufacturing optimization criterion. In current mask masking, a root mean square (RMS) variation of no more than 1 nm (1 sigma) in pattern size may be desired. More size variation translates to more variation in circuit performance, leading to higher design margins being required, making it increasingly difficult to design faster, lower-power integrated circuits. This variation is referred to as critical dimension (CD) variation. A low CD variation is desirable, and indicates that manufacturing variations will produce relatively small size variations on the final manufactured surface. In the smaller scale, the effects of a high CD variation may be observed as line edge roughness (LER). LER is caused by each part of a line edge being slightly differently manufactured, leading to some waviness in a line that is intended to have a straight edge. CD variation is, among other things, inversely related to the slope of the dosage curve at the resist threshold, which is called edge slope. Therefore, edge slope, or dose margin, is a critical optimization factor for particle beam writing of surfaces. In this disclosure, edge slope and dose margin are terms that are used interchangeably.

With conventional fracturing, without shot overlap, gaps or dose modulation, the dose margin of the written shapes is considered immutable: that is, there is no opportunity to improve dose margin by a choice of fracturing options. In modern practice, the avoidance of very narrow shots called slivers is an example of a practical rule-based method that helps to optimize the shot list for dose margin.

In a fracturing environment where overlapping shots and dose-modulated shots can be generated, there is both a need and an opportunity to optimize for dose margin. The additional flexibility in shot combinations allowed by use of shot overlap and dose modulation allows generation of fracturing solutions that appear to generate the target mask shapes on the surface, but may do so only under perfect manufacturing conditions. The use of overlapping shots and dose-modulated shots therefore creates incentive to address the issue of dose margin and its improvement.

Figure 11A:
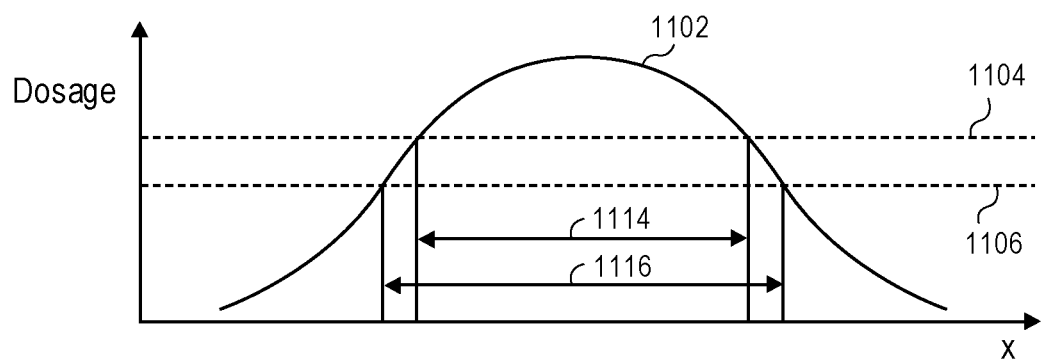
FIG. 11A illustrates an example of a cross-sectional dosage graph, showing registered pattern widths for each of two resist thresholds.
Figure 11B:
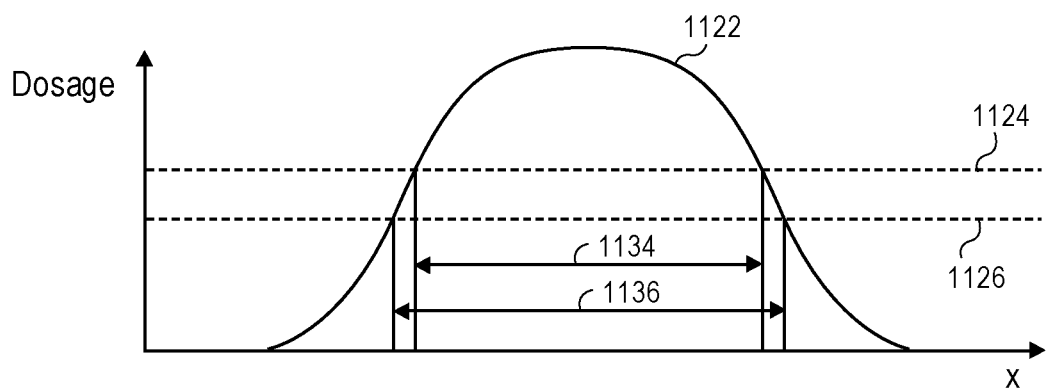
FIG. 11B illustrates an example of a cross-sectional dosage graph similar to FIG. 11A, but with a higher dosage edge slope than in FIG. 11A.

FIGS. 11A-B illustrate how critical dimension variation can be reduced by exposing the pattern on the resist so as to produce a relatively high edge slope in the exposure or dosage curve, such as is described in U.S. Pat. No. 8,473,875, entitled "Method and System for Forming High Accuracy Patterns Using Charged Particle Beam Lithography," which is hereby incorporated by reference for all purposes. FIG. 11A illustrates a cross-sectional dosage curve 1102, where the x-axis shows the cross-sectional distance through an exposed pattern—such as the distance perpendicular to two of the pattern's edges—and the y-axis shows the dosage received by the resist. A pattern is registered by the resist where the received dosage is higher than a threshold. Two thresholds are illustrated in FIG. 11A, illustrating the effect of a variation in resist sensitivity. The higher threshold 1104 causes a pattern of width 1114 to be registered by the resist. The lower threshold 1106 causes a pattern of width 1116 to be registered by the resist, where width 1116 is greater than width 1114. FIG. 11B illustrates another cross-sectional dosage curve 1122. Two thresholds are illustrated, where threshold 1124 is the same as threshold 1104 of FIG. 11A, and threshold 1126 is the same as threshold 1106 of FIG. 11A. The slope of dosage curve 1122 is higher in the vicinity of the two thresholds than is the slope of dosage curve 1102. For dosage curve 1122, the higher threshold 1124 causes a pattern of width 1134 to be registered by the resist. The lower threshold 1126 causes a pattern of width 1136 to be registered by the resist. As can be seen, the difference between width 1136 and width 1134 is less than the difference between width 1116 and width 1114, due to the higher edge slope of dosage curve 1122 compared to dosage curve 1102. If the resist-coated surface is a reticle, then the lower sensitivity of curve 1122 to variation in resist threshold can cause the pattern width on a photomask manufactured from the reticle to be closer to the target pattern width for the photomask, thereby increasing the yield of usable integrated circuits when the photomask is used to transfer a pattern to a substrate such as a silicon wafer. Similar improvement in tolerance to variation in dose for each shot is observed for dose curves with higher edge slopes. Achieving a relatively higher edge slope such as in dosage curve 1122 is therefore desirable.

Multi-beam charged particle beam writers are generally faster than single-beam charged particle beam writers such as conventional VSB writers. Currently, however, the majority of reticles to be used for semiconductor optical lithography are exposed with VSB writers. Therefore numerous electronic design automation (EDA) and related software vendors have the capability to create shot data which is formatted for one or more of the existing VSB writers. To support usage of newer multi-beam writers in existing production environments, it would be advantageous to be able to read data in existing formats, such as VSB shot files, and then expose a reticle with multi-beam shots. Numerous ways in which this may be accomplished are disclosed herein.

Figure 5:
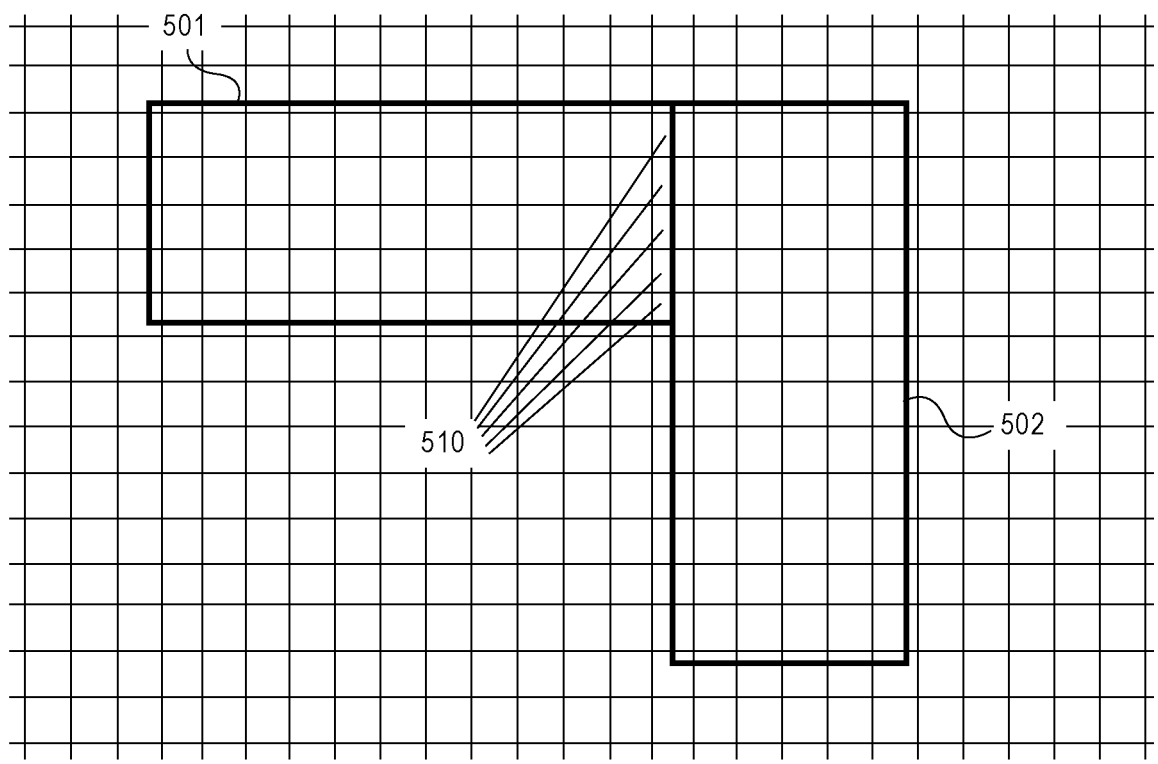
FIG. 5 illustrates an example of two non-overlapping VSB shots overlaid on a grid of multi-beam beamlet pixels.

FIG. 5 illustrates an example of two conventional non-overlapping VSB shots 501 and 502. In this example, both shots 501 and 502 have a shot dosage of 1.0, meaning 1.0 times the base dosage. Superimposed on these two shots is a pixel grid, such as a pixel grid available in a multi-beam writer. As can be seen, the shots do not align with the pixel boundaries. Additionally, although the VSB shots do not overlap, there are pixels which both shots overlap, specifically pixels 510. To create multi-beam shot information which is equivalent to VSB shots 501 and 502, one method is to combine the shot dosages:

The pixels which are fully-enclosed by either shot 501 or shot 502 should have a dosage of 1.0.

The pixels 510 should also have a dosage of 1.0.

Pixels on the perimeters of shot 501 or shot 502, other than pixels 510, should have a dosage greater than 0.0 and less than 1.0. In one embodiment, the dosage may be based on the fraction of the pixel area that is enclosed by one of the VSB shots.

Figure 13A:
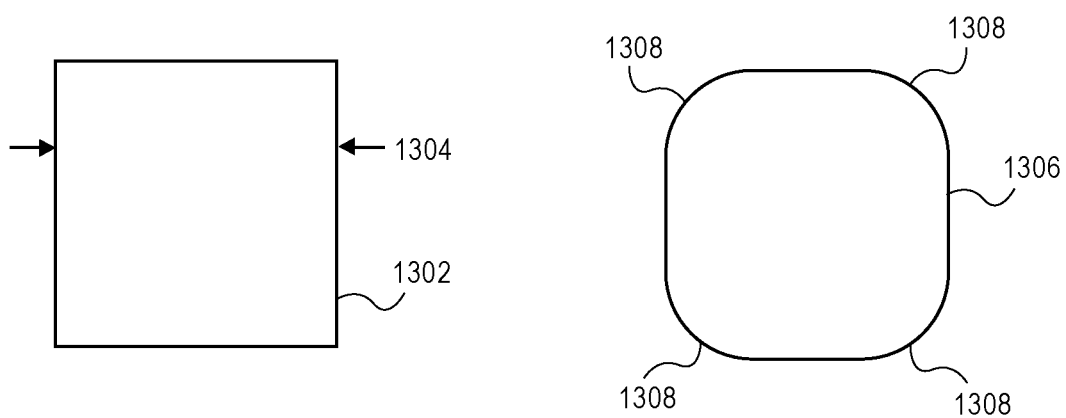
FIG. 13A illustrates an example of how a 100 nm square VSB shot may be registered on a surface.
Figure 13B:
FIG. 13B illustrates an example of how a 60 nm square VSB shot may be registered on a surface.

FIG. 13A illustrates an example of a square VSB shot 1302. In this example square 1302 has a dimension 1304 of 100 nm. Pattern 1306 is an example of how shot 1302, with a normal dose, may register on a resist-coated surface. As can be seen, the corners 1308 of pattern 1306 are rounded, due to beam blur. If formed on a reticle to be used for optical lithography using 4× reduction printing, pattern 1306 could be used to form a pattern on a wafer having a size of approximately 25 nm. FIG. 13B illustrates an example of a smaller square VSB shot 1312. In this example, the dimension 1314 of shot 1312 is 60 nm. Pattern 1316 is an example of how shot 1312 may register on a resist-coated surface. As can be seen, the corner rounding effects of beam blur have caused the registered pattern to be virtually circular. Additionally, the diameter of the pattern 1316 is less than the 60 nm size of shot 1312. Additionally, though not illustrated, the edge slope of pattern 1316 will be lower than that of pattern 1306, and may be below a minimum pre-determined level to produce acceptable CD variation. FIGS. 13A&B illustrate how due to various effects, the patterns formed on a surface using charged particle beam lithography may differ significantly from the simple geometrical union of the areas of the shot(s) which form the patterns. This difference becomes more pronounced for patterns less than 100 nm in the smallest dimension. Charged particle beam simulation may be used to calculate the pattern that will be formed on a surface using a set of charged particle beam shots.

Figure 14A:
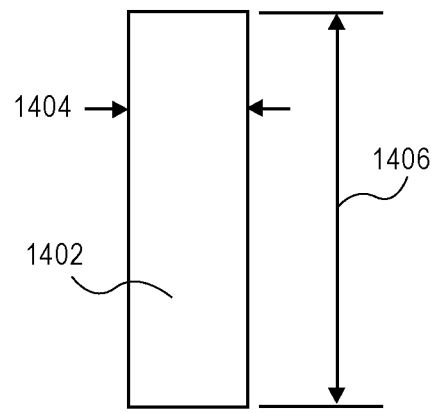
FIG. 14A illustrates an example of a desired 100 nm wide line pattern to be formed on a surface.
Figure 14B:
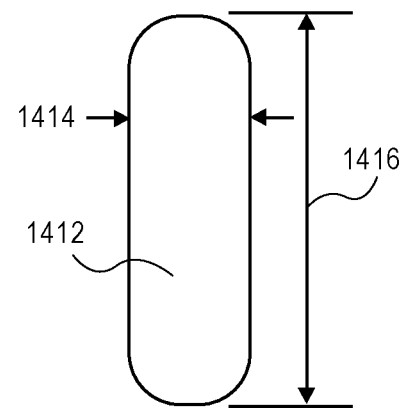
FIG. 14B illustrates an example of a simulated pattern formed using a single 100 nm wide VSB shot.

FIG. 14A illustrates an example of a designed pattern 1402. Pattern 1402 is designed to have a constant width 1404, the width being 100 nm, and a length 1406. FIG. 14B illustrates an example of a simulated pattern 1412 that may be formed on a surface using a conventional VSB shot, where the VSB shot is a 100 nm wide rectangle, and of a normal dosage. The width 1414 of the simulated pattern 1412 is approximately 100 nm, and the length 1416 of the simulated pattern 1412 is approximately equal to length 1406 of designed pattern 1402. As can be seen, however, the corners of simulated pattern 1412 are significantly rounded compared to the corners of designed pattern 1402.

Figure 14C:
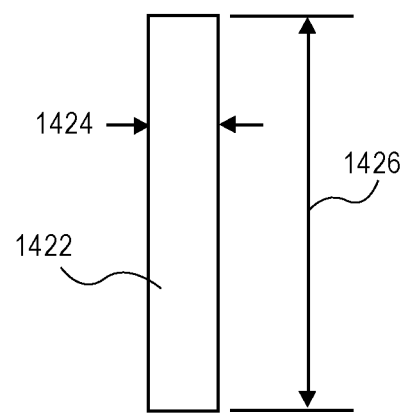
FIG. 14C illustrates an example of a desired 60 nm wide line pattern to be formed on a surface.
Figure 14D:
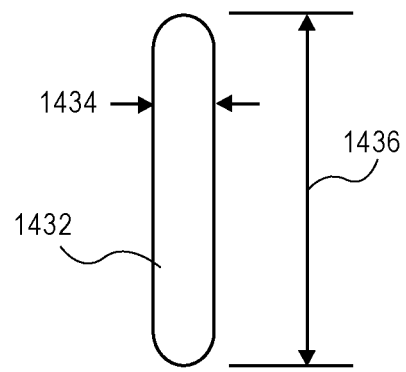
FIG. 14D illustrates an example of a simulated pattern formed using a single 60 nm wide VSB shot.

FIG. 14C illustrates an example of a designed pattern 1422. Pattern 1422 is designed to have a constant width 1424 of 60 nm, and a length 1426. FIG. 14D illustrates an example of a simulated pattern 1432 that may be formed on a surface using a conventional VSB shot, where the VSB shot is a 60 nm wide rectangle, and of a normal dosage. The width 1434 is less than the designed width 1424 of 60 nm, due to the limitations of charged particle lithography when drawing patterns narrower than about 100 nm. Additionally, the length 1436 of pattern 1432 is less than the designed length 1426. The corners of pattern 1432 are also rounded, compared to the corners of pattern 1422.

FIGS. 14A-D illustrate that patterns produced by charged particle beam lithography may differ significantly from the union of the areas of shots used to expose the patterns, even when exposed conventionally using non-overlapping, normal dosage shots. If exposed with normal dosage shots, patterns with minimum dimensions less than 100 nm will differ more from the union of shots than will larger patterns. Charged particle beam simulation may be used to determine the patterns that will be formed on a surface from a shot or set of shots.

Figure 6A:
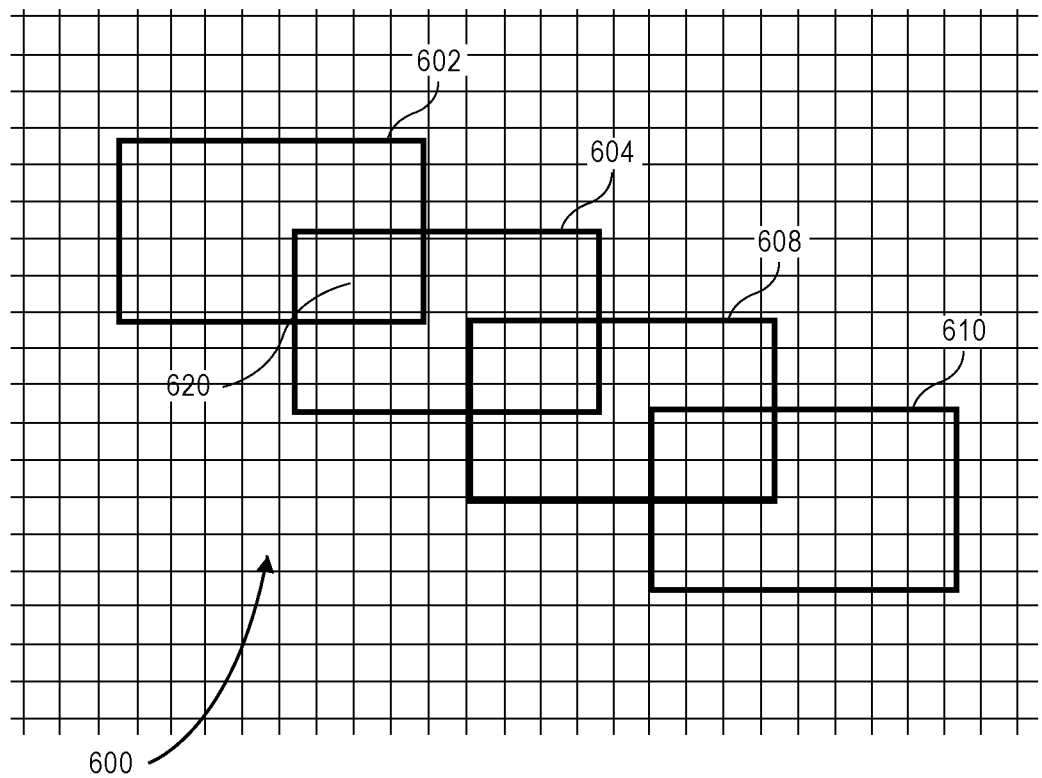
FIG. 6A illustrates an example of four overlapping VSB shots overlaid on a grid of multi-beam beamlet pixels.
Figure 6B:
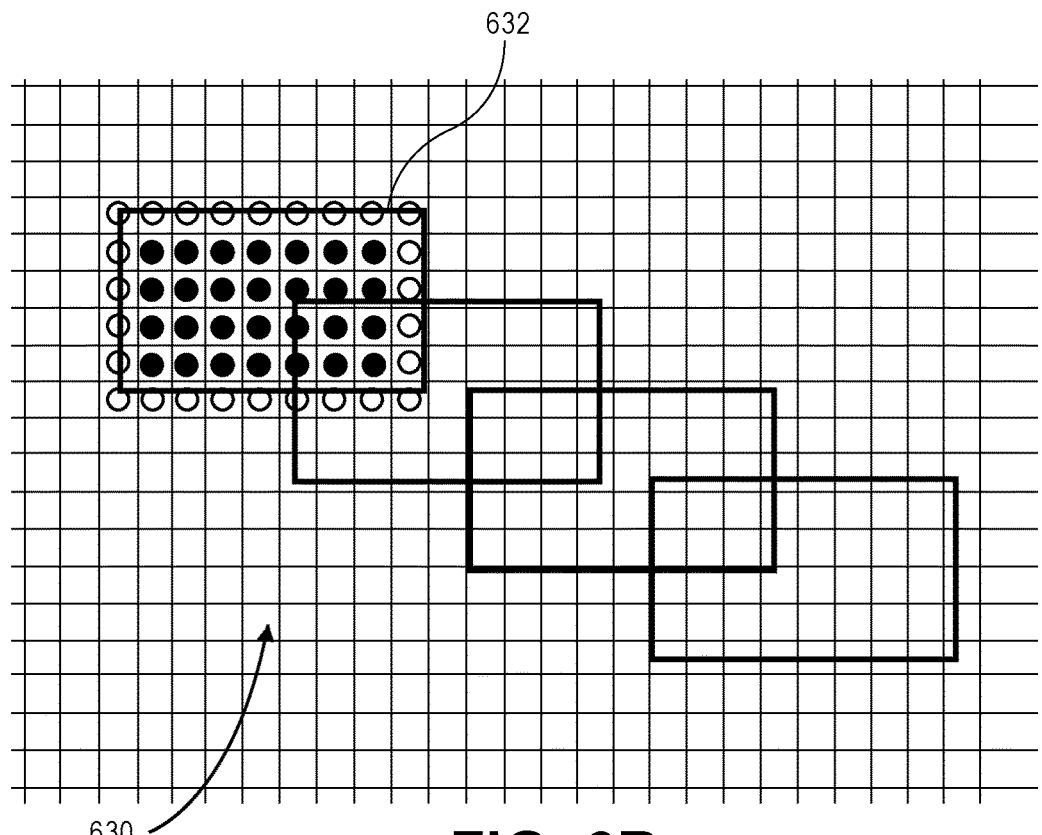
FIG. 6B illustrates a group of multi-beam pixels generated from one of the VSB shots of FIG. 6A.
Figure 6C:
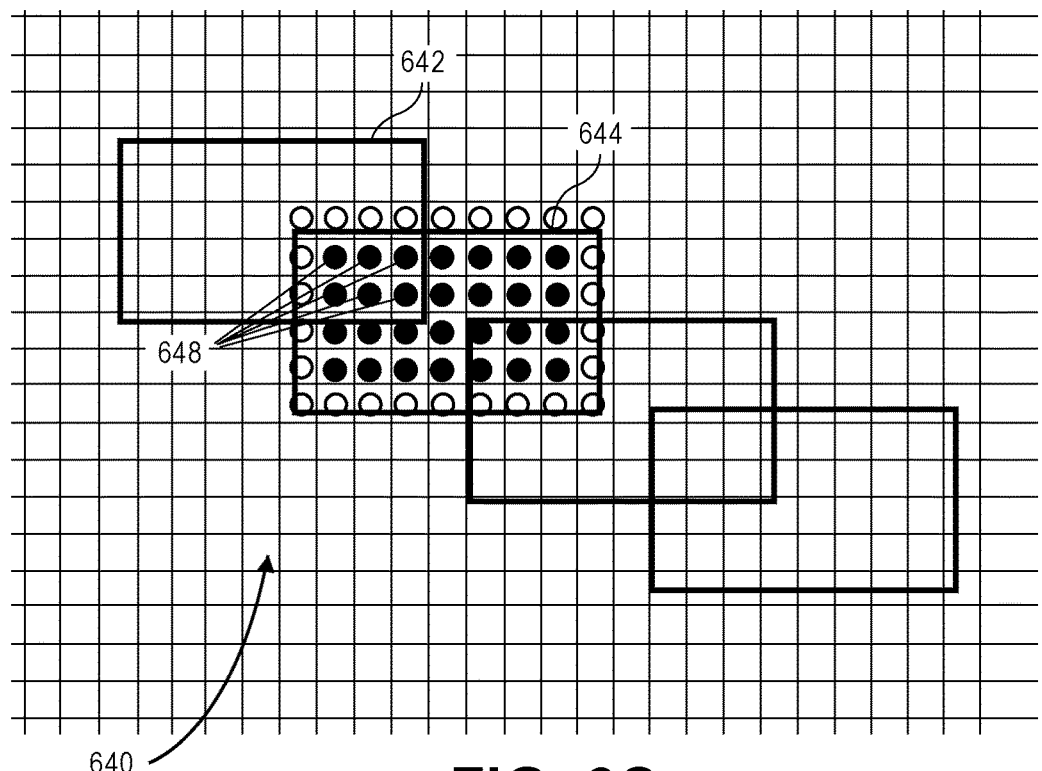
FIG. 6C illustrates a group of multi-beam pixels generated for another one of the VSB shots of FIG. 6A.

FIGS. 6A-C illustrate an example of one embodiment of how multi-beam exposure information may be generated from a single-beam shot information, such as a set of VSB shots. In this example the single-beam shots overlap. FIG. 6A illustrates a group of VSB shots 600 which comprises four shots 602, 604, 608 and 610. Adjacent shots overlap; for example shot 602 and shot 604 overlap in the area 620. In this example, all VSB shots have a shot dosage of 1.0. The four VSB shots, if exposed in a conventional VSB writer, would create higher dosage in the areas of overlap, such as area 620. Superimposed on set of shots 600 is a multi-pass pixel grid. In some embodiments, the pixel grid pitch—the distance between pixels—may represent the pitch of a grid of beamlets in a multi-beam exposure system. In other embodiments, the pixel grid pitch may represent the grid pitch available on a multi-beam exposure system by using multiple exposure passes with offset beamlet alignment among the exposure passes. In one example, the spacing of the pixels in the pixel grid is one-half of the beamlet spacing, where the smaller pixel spacing is obtained using two exposure passes in which the beamlet alignment is offset by one-half of a beamlet pitch for the second pass compared to the first pass. For example, if the beamlet pitch may be 20 nm, a 10 nm pixel grid can be supported using two exposure passes if the beamlets in the second exposure pass are offset 10 nm compared to the first exposure pass. In this case beamlet shots from the second exposure pass may overlap beamlet shots from the first exposure pass, but the pixel grid is still considered to be 10 nm.

FIG. 6B illustrates the same group of shots 630 as in FIG. 6A shot group 600. Shot group 630 illustrates an example of multi-beam pixels generated for VSB shot 632 only. The solid circular dots denote those pixels which are totally enclosed by the outline of VSB shot 632, and which may receive a pixel dosage of 1.0. Open circular dots denote those pixels which are only partially enclosed by VSB shot 632 and which may receive a lower dosage. FIG. 6C illustrates the same group of shots 640 as in FIG. 6A shot group 600. Shot group 640 illustrates an example of multi-beam pixels generated for VSB shot 644 only. The solid circular dots denote those pixels which are totally enclosed by the outline of VSB shot 644, and which may receive a pixel dosage of 1.0. Open circular dots denote those pixels which are only partially enclosed by VSB shot 644 and which may receive a lower dosage. As can be seen, pixels 648 which are totally enclosed by both VSB shot 642 (the same as shot FIG. 6B shot 632) and VSB shot 644 receive dosage both from the shot 632 multi-beam dosage and from the shot 644 multi-beam dosage, similar to when using overlapping VSB shots. In some embodiments, the combined dosage for the pixels 648 enclosed by both VSB shot 642 and VSB shot 644 is determined by adding the dosages, pixel by pixel or beamlet by beamlet, for the multi-beam conversion of VSB shot 642 (which is also VSB shot 632) and VSB shot 644. In some embodiments, the conversion of shot 632/642 to multi-beam pixels and the conversion of shot 644 to multi-beam pixels may be done simultaneously, by different computing resources. The conversion of shot 632/642 is initially done independently from shot 644—i.e. the pixel dosages assigned during the conversion of shot 644 do not depend on pixel dosages assigned during the conversion of shot 632/642. In this example, using addition to combine pixel dosages, the dosage in the pixels 648 which are fully-enclosed by both shots 632/642 and 644 is 2.0.

Figure 7:
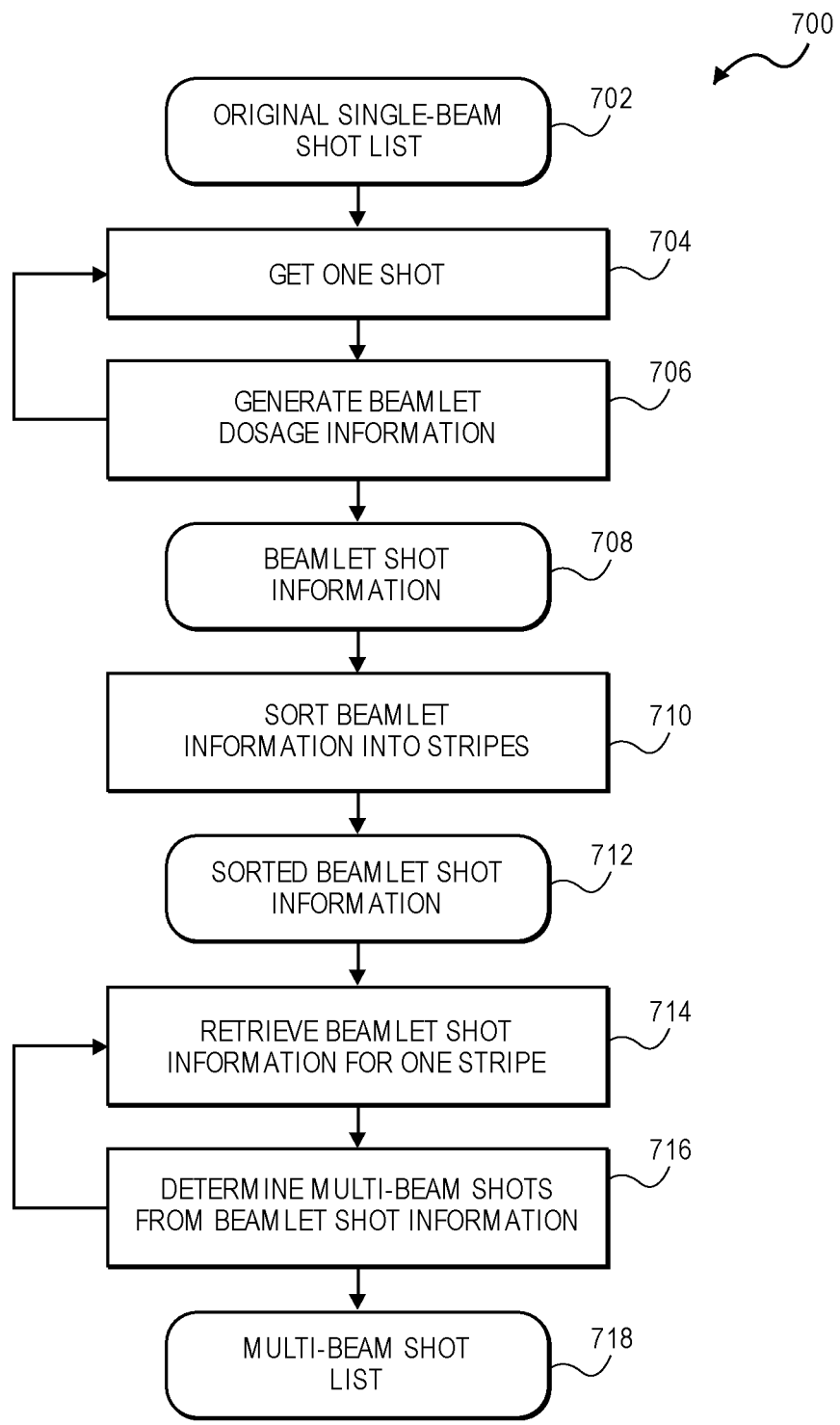
FIG. 7 illustrates a conceptual flow diagram of an exemplary method for creating a multi-beam shot list from a single-beam shot list.

FIG. 7 is a conceptual flow diagram 700 of an exemplary method for converting a single-beam shot list to a multi-beam shot list. The input to the process is an original single-beam shot list 702. In some embodiments, this will be a shot list containing only VSB shots. In step 704, a single shot is retrieved from original shot list 702. The single shot may comprise a specified dosage. Alternatively, dosage of the single shot may be unspecified, in which case dosage information is obtained from another source, such as a base dosage specification. In step 706, multi-beam beamlet exposure information is determined which is equivalent to the single VSB shot, within a pre-determined tolerance, such as described for shot 632 of FIG. 6B above. In some embodiments, beamlet exposure information may be determined for multiple exposure passes of a multi-beam exposure system, in which case beamlets for one pass may be offset compared to beamlets in another pass. For example, beamlets may be 20 nm in size, and two passes may be used in which the beamlets are offset 10 nm—i.e. one-half the size of a beamlet—between exposure passes. The output of step 706 is a set of beamlet shots with dosages. In some embodiments, this set of beamlet shots is appended to other beamlet shot information 708 generated from other single beam shots, so that after the last single-beam shot is processed in step 706, the beamlet shot information 708 comprises all the beamlet shot information. In some embodiments, a multi-beam machine's exposure process may be organized into stripes, with each stripe comprising a plurality of multi-beam shots. In these embodiments, in step 710 the beamlet shot information may be sorted into stripes. Step 710 may also comprise sorting the beamlet shot information into a plurality of exposure passes. The output of step 710 is a sorted list of beamlet shot information 712. In step 714, beamlet shot information for a single stripe is retrieved, and is then converted into multi-beam shots in step 716. Each multi-beam shot comprises a plurality of beamlets. The multi-beam shots generated in step 716 are output to a multi-beam shot list 718. Steps 714 and 716 are then re-run for another stripe, until all stripes—including possibly all stripes of multiple exposure passes—have been processed. When all stripes have been processed, the multi-beam shot list 718 is complete.

In other embodiments of method 700, sorting of the patterns into stripes 710 may be omitted, or sorting may be based on a criterion other than stripes. The general advantage of data localization which sorting can provide is to reduce the amount of data that the multi-beam shot determination step 716 needs to have available to it at a given time.

In other embodiments of method 700, the step 706 of generating beamlet dosage information for one single-beam shot may be parallelized, such as by using multiple program threads, so that a plurality of single-beam shots are processed by step 706 in parallel.

Figure 8A:
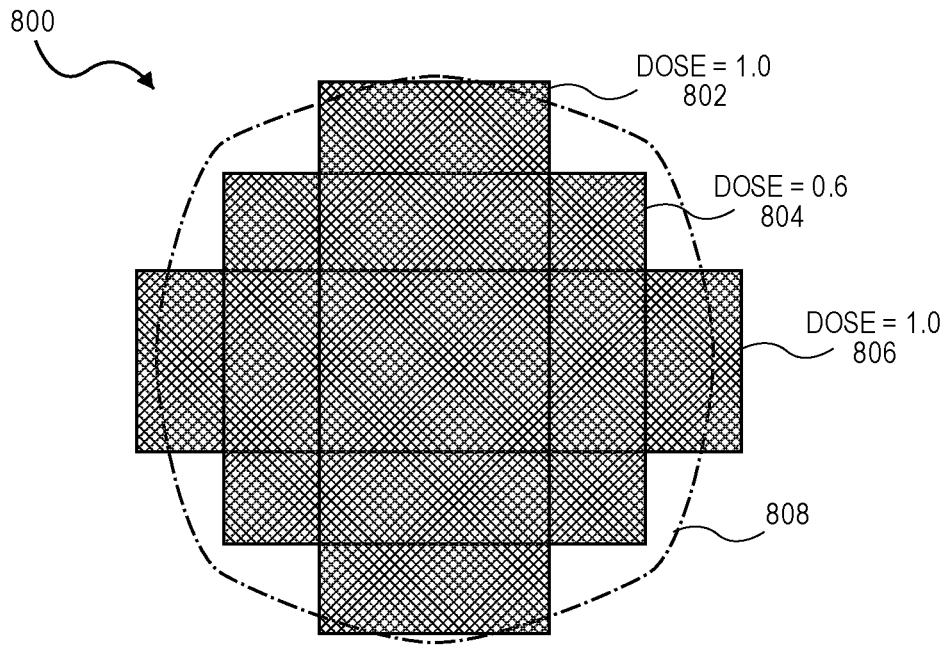
FIG. 8A illustrates an example of three overlapping VSB shots which can form a nearly-circular pattern on a surface.
Figure 8B:
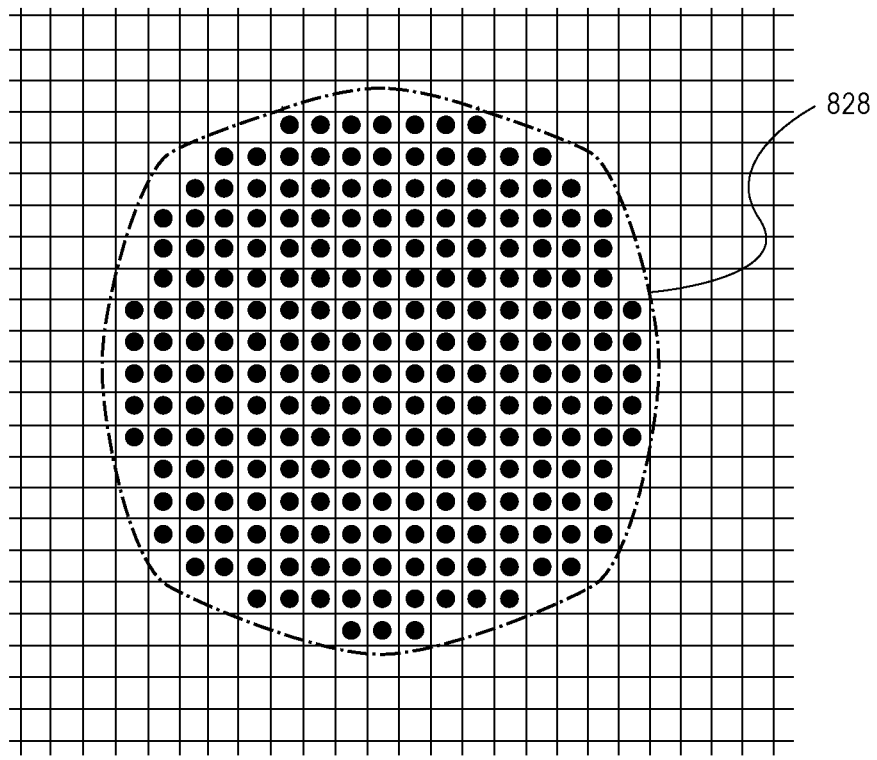
FIG. 8B illustrates an example of beamlet pixels into which the three overlapping shots of FIG. 8A may be converted for a multi-beam exposure system.

FIGS. 8A-B illustrate another embodiment of the present disclosure. FIG. 8A illustrates an example of a set of three VSB shots 800, including shot 802, shot 804 and shot 806. All shots have specified dosages: shot 802 has a dose of 1.0, shot 804 has a dose of 0.6, and shot 806 has a dose of 1.0. Set of shots 800 can be simulated using charged particle beam simulation to calculate, for example, a pattern 808 that will be produced on a resist-coated surface. In this embodiment, beamlet shot information is generated which will generate the calculated surface pattern, such as pattern 808. FIG. 8B illustrates a shape outline 828 which is the same as shape outline 808. FIG. 8B also illustrates an example of a beamlet grid which is overlaid on shape outline 828. FIG. 8B, beamlet grids which are completely enclosed by shape outline 828 are marked with a circular dot. In some embodiments, beamlets which are completely enclosed by shape outline 828 may be assigned the same dosage, such as 1.0. In general, beamlets other than those which are completely enclosed may also be assigned a non-zero dosage. In this embodiment, the beamlet dosages are assigned so as to form a calculated shape on the surface, such as the calculated shape 808/828 in this example. In other embodiments, charged particle beam simulation may include determining the dose margin of shape outline 808/828, and multi-beam beamlet dosages can be generated which will preserve or enhance—i.e. increase—the dose margin.

Figure 9:
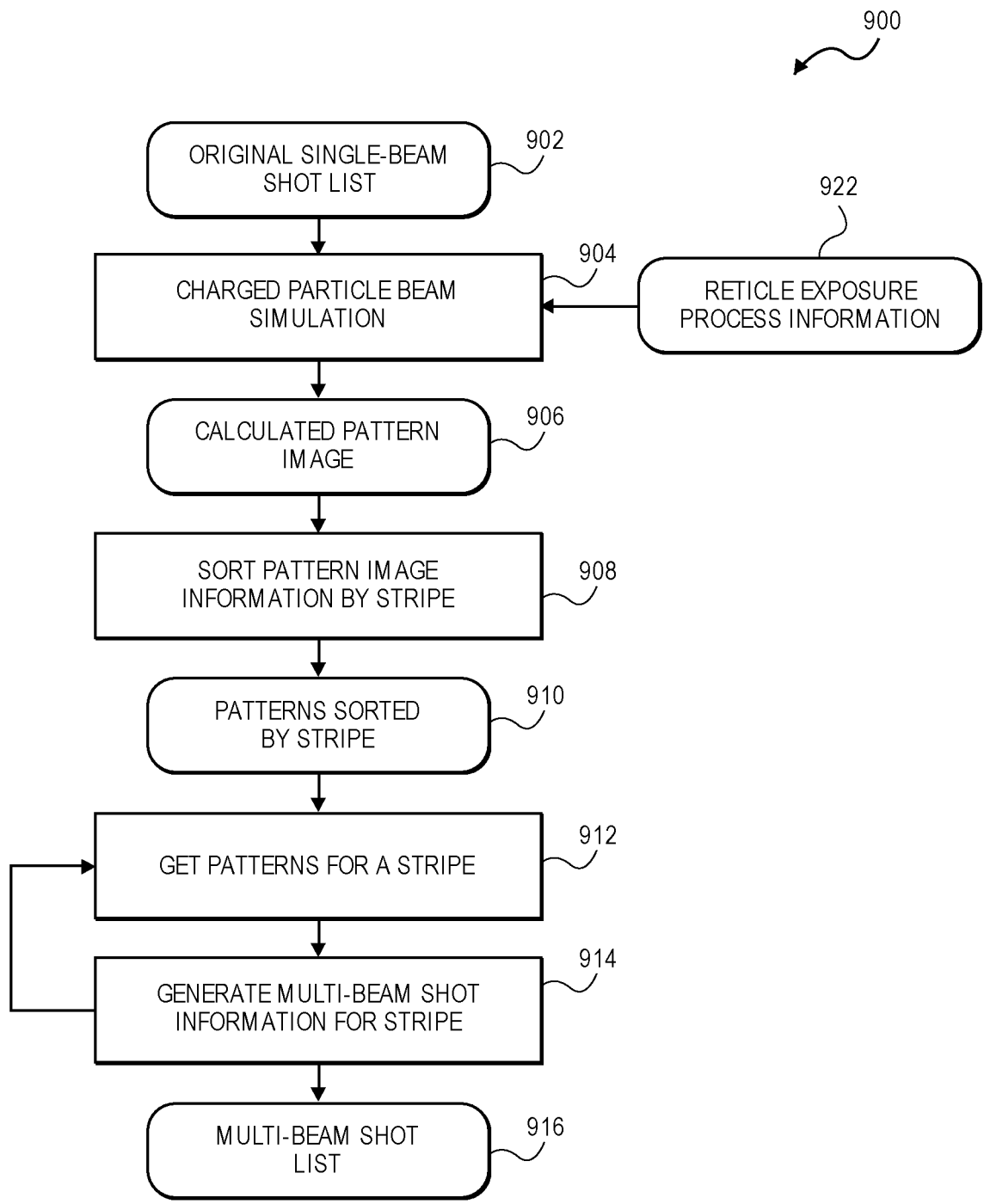
FIG. 9 illustrates a conceptual flow diagram for creating a multi-beam shot list from a single-beam shot list, using calculated pattern information, in accordance with some embodiments.

FIG. 9 is a conceptual flow diagram 900 of an exemplary method for converting single-beam shot information to multi-beam shot information using calculated pattern information. The input is an original single-beam shot list 902. That is, a set of single-beam charged particle beam shots is input. In step 904 charged particle beam simulation is performed on the shots in original shot list 902, to calculate a pattern image 906. Step 904 may also use as input reticle exposure process information 922. Effects that may be simulated include forward scattering, backward scattering, resist diffusion, Coulomb effect, fogging, loading and resist charging. The output of charged particle beam simulation is a calculated pattern image 906. The calculated pattern image may represent an aerial image that will be formed on a surface. The calculated pattern image may also represent a post-development pattern that will be formed on the surface. In some embodiments, the calculated pattern image 906 comprises a set of pattern contours, such as the outline 828 in FIG. 8B. In other embodiments, the calculated pattern image 906 comprises dose margin information. In some embodiments, the multi-beam machine's exposure process may be organized into stripes, with each stripe comprising a plurality of multi-beam shots. In these embodiments, the calculated pattern image information is sorted by stripe in step 908 to obtain a set of sorted patterns 910. In some embodiments, patterns which cross stripe boundaries may be split. In other embodiments, patterns may not be split. In step 912 the patterns associated with a single stripe are retrieved. Patterns that cross stripe boundaries may be retrieved for a plurality of stripes. In step 914, multi-beam shots are generated for a single stripe, where the multi-beam shots will form the portion of the retrieved patterns which are in single stripe. The generated multi-beam shots are output to a multi-beam shot list 916. Patterns for another stripe are then retrieved in step 912, and these multi-beam shots are generated. The process repeats until all sorted patterns 910, have been processed. Thus, the method of FIG. 9 generates a set of multi-beam shots which will produce a surface image, where the surface image matches the calculated image, within a pre-determined tolerance. In some embodiments, the set of multi-beam shots may be generated to improve—i.e. increase—dose margin in areas where the calculated image dose margin is lower than a pre-determined desired dose margin. The generating of multi-beam shots is performed using a computing hardware processor In some embodiments of method 900, multi-beam shots for multiple exposure passes may be generated. In some embodiments, multi-beam shots for all exposure passes are generated at the same time, such for all patterns retrieved for a stripe in step 912. An advantage of generating multi-beam shots for all exposure passes at same time is that the combined dosage from shots in all exposure passes can be calculated relatively easy for a given area of the surface.

In other embodiments of method 900, sorting of the patterns may be skipped, or sorting based on a criterion other the stripes may be used. The general advantage of data localization is to reduce the amount of data that the shot generation step 914 needs to have available to it at a given time.

Figure 10:
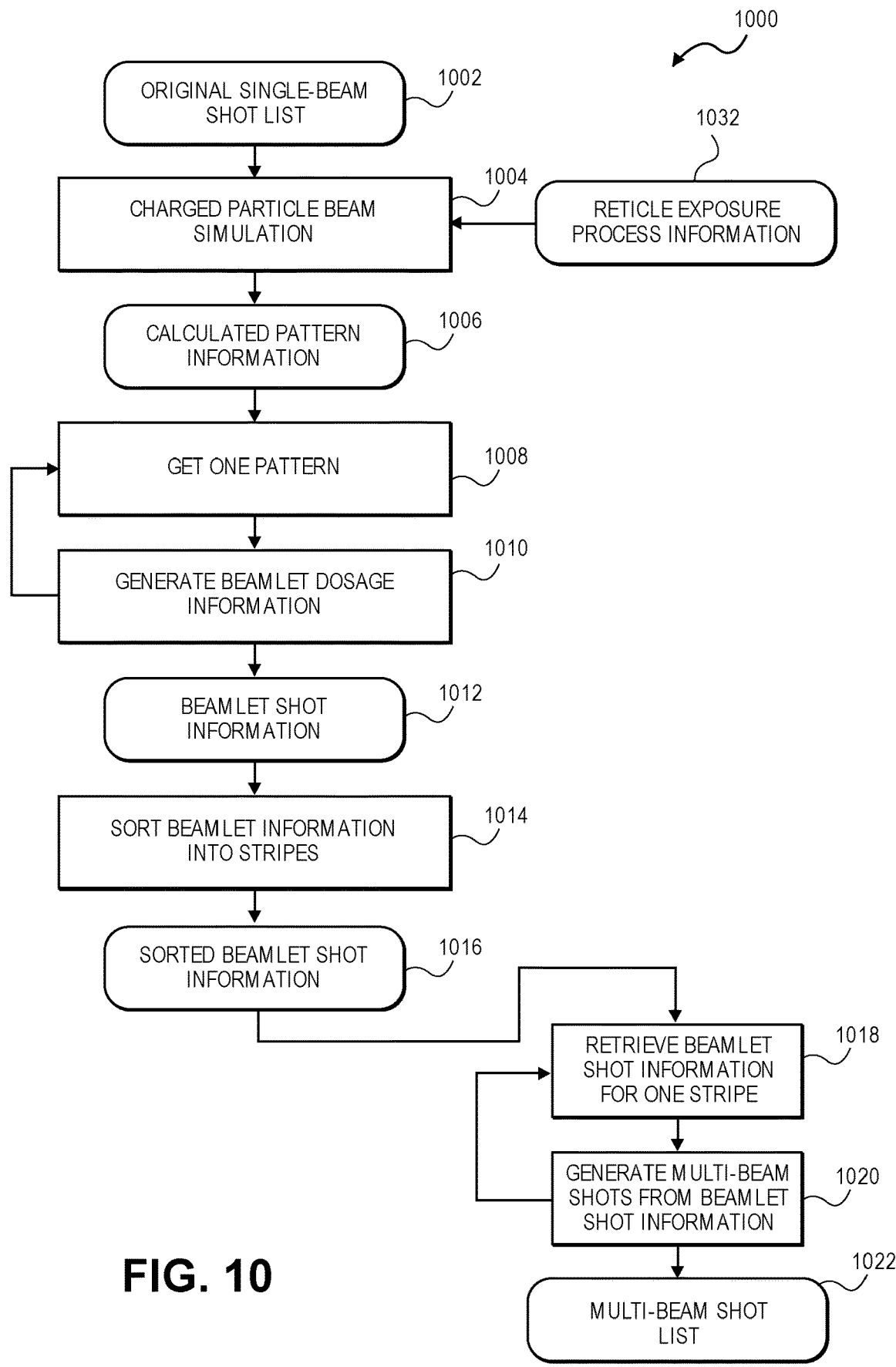
FIG. 10 illustrates a conceptual flow diagram for creating a multi-beam shot list from a single-beam shot list, using calculated pattern information, in accordance with some embodiments.

FIG. 10 is a conceptual flow diagram 1000 of another exemplary method for converting single-beam shot information to multi-beam shot information using calculated pattern information. Compared to method 900, in method 1000 pattern information is converted to beamlet or pixel shot information, which may include dosage information, and then the beamlet or pixel information, possibly after a sorting step, is converted into multi-beam shots. The input to method 1000 is an original single-beam shot list 1002. In step 1004 charged particle beam simulation is performed on the shots in original shot list 1002, using as additional input reticle exposure process information 1032. Effects that may be simulated include forward scattering, backward scattering, resist diffusion, Coulomb effect, fogging, loading and resist charging. The output of charged particle beam simulation is a set of calculated pattern information 1006. The set of calculated pattern information may represent an aerial image that will be formed on a surface. The set of calculated pattern information may also represent a post-development pattern that will be formed on the surface. In some embodiments, the calculated pattern information 1006 comprises a set of pattern contours; that is, contour information for the one or more patterns. In other embodiments, the calculated pattern information 1006 comprises dose margin information. In step 1008, a single calculated pattern information is retrieved from the set of patterns 1006. In step 1010, beamlet exposure information is determined which will produce a pattern on the surface which is equivalent to the single calculated pattern information, within a pre-determined tolerance. In some embodiments, beamlet exposure information may be determined for multiple exposure passes of a multi-beam exposure system. In some multiple exposure pass embodiments, beamlets for one pass may be offset compared to beamlets in another pass. The output of step 1010 is a set of beamlet shots with dosages 1012. Beamlet shot information 1012 may be appended to the beamlet shot information from other calculated patterns. The steps 1008 and 1010 may be repeated for each calculated pattern information, until beamlet shot information has been generated for all the calculated pattern information 1006. When all calculated pattern information 1006 has been processed by step 1008, beamlet shot information 1012, containing the appended beamlet shot information from all the pattern information, comprises beamlet shot information for the entire original shot list 1002.

In some embodiments, a multi-beam machine's exposure process may be organized into stripes, with each stripe comprising plurality of multi-beam shots. In these embodiments, in step 1014 the beamlet shot information may be sorted into stripes. Step 1014 may also comprise sorting the beamlet shot information into a plurality of exposure passes. The output of step 1014 is a sorted list of beamlet shot information 1016. In step 1018, beamlet shot information for a single stripe is retrieved, and in subsequent step 1020 multi-beam shots are generated from the beamlet shot information. Each multi-beam shot comprises a plurality of beamlets. The multi-beam shots generated in step 1020 are output to a multi-beam shot list 1022. Steps 1018 and 1020 are then re-run for another stripe, until all stripes—including possibly all stripes of multiple exposure passes—have been processed. When all stripes have been processed, the multi-beam shot list 1022 is complete.

In other embodiments of method 1000, sorting of the patterns into stripes 1014 may be omitted, or sorting may be based on a criterion other than stripes. The advantage of data localization which sorting can provide is to reduce the amount of data that the multi-beam shot determination step 1020 needs to have available to it at a given time.

In some embodiments, some calculated patterns 1006 may be split, such as patterns that are larger than a pre-determined maximum size. Splitting large patterns may improve the performance of the beamlet generation step 1010, including by allowing increased parallelization of this step when using multi-threaded programming techniques.

Figure 15:
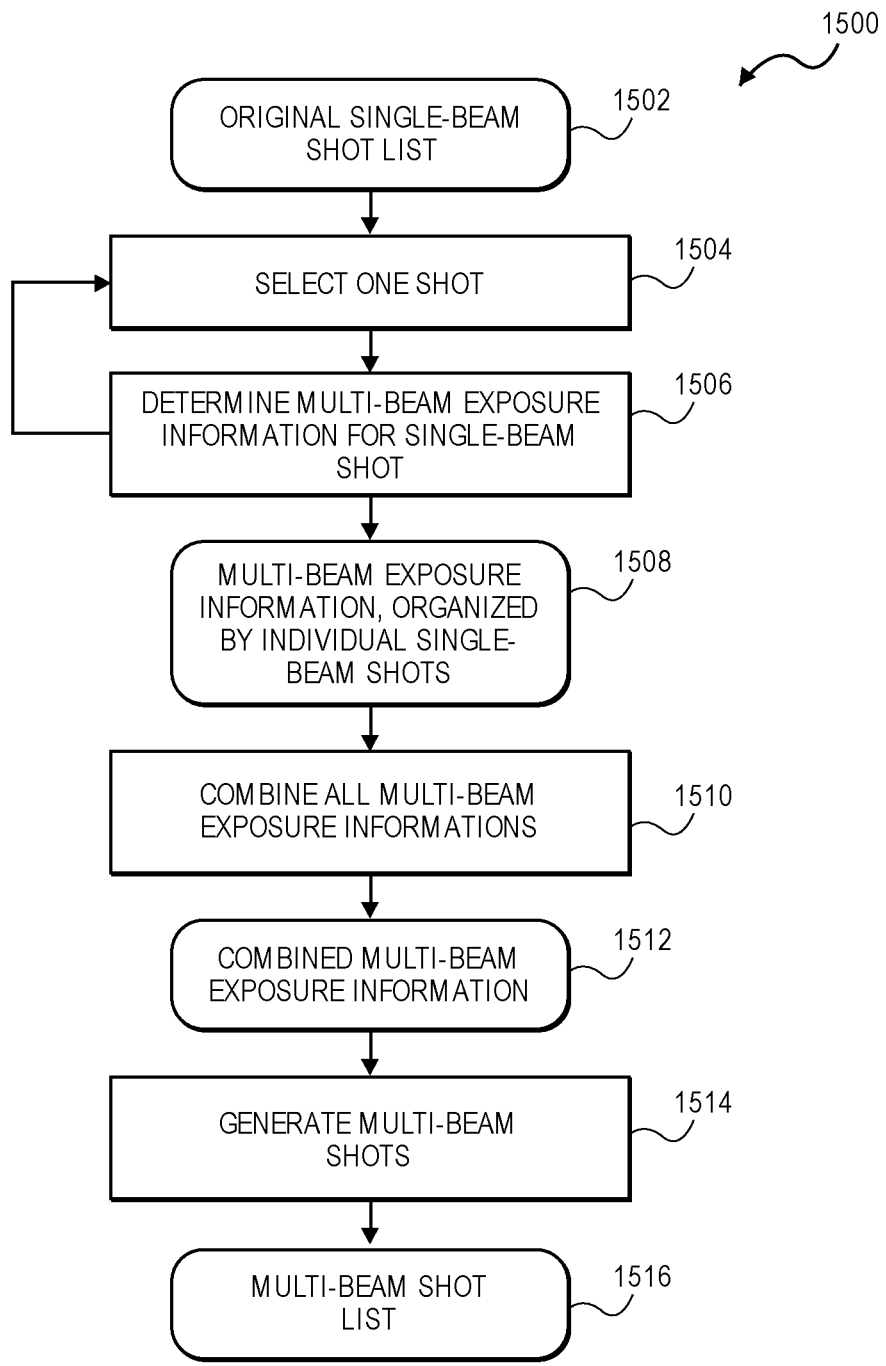
FIG. 15 illustrates a conceptual flow diagram for creating a multi-beam shot list from a single-beam shot list, in accordance with some embodiments.

FIG. 15 is a conceptual flow diagram 1500 of another exemplary method for converting single-beam shot information to multi-beam shot information. The input to method 1500 is a set of single-beam charged particle beam shots 1502. In some embodiments, shots in shot list 1502 may have assigned dosages. In step 1504, one single-beam shot is selected. In step 1506, multi-beam exposure information is determined for the selected single-beam shot. This information may, for example, be pixel or beamlet exposure information, including dosages. The multi-beam exposure information for the selected shot is temporarily stored with multi-beam information for other single-beam shots as multi-beam exposure information 1508. In multi-beam exposure information 1508, information may be organized separately for each selected single-beam shot, with multi-beam exposure information generated for a first selected input shot not being merged with multi-beam exposure information generated for a second selected input shot. In step 1510 the multi-beam exposure information 1508 for all of the selected input shots is combined. The combining may include combining dosages for individual pixels or beamlets which were determined for various input single-beam shots, for example in the case where input single-beam shots overlap. The output of step 1510 is a combined multi-beam exposure information 1512, which may include dosage information for each individual pixel or beamlet in the design. In step 1514 multi-beam shots are generated from the combined multi-beam exposure information, to create a multi-beam shot list 1516. In other embodiments, step 1506 and step 1510 may be combined, so that as multi-beam exposure information is determined for a selected single-beam shot 1504, the multi-beam exposure information is immediately merged with the combined multi-beam exposure information determined for previously-selected single-beam shots.

In other embodiments, converting single-beam shot information to multi-beam shot information may be learned in a neural network using calculated pattern images. A neural network is a framework of machine learning algorithms that work together to predict images based on a previous training process. Embodiments include training a neural network to calculate a predicted image on a wafer from a set of single-beam shots, where the predicted image is then used to generate a set of multi-beam shots. Using calculated pattern images to train a neural network achieves the same goals as in previous embodiments, however once trained, the transformation in the neural network may be much faster, such as 10X faster, than with charged particle beam simulation alone.

Figure 16:
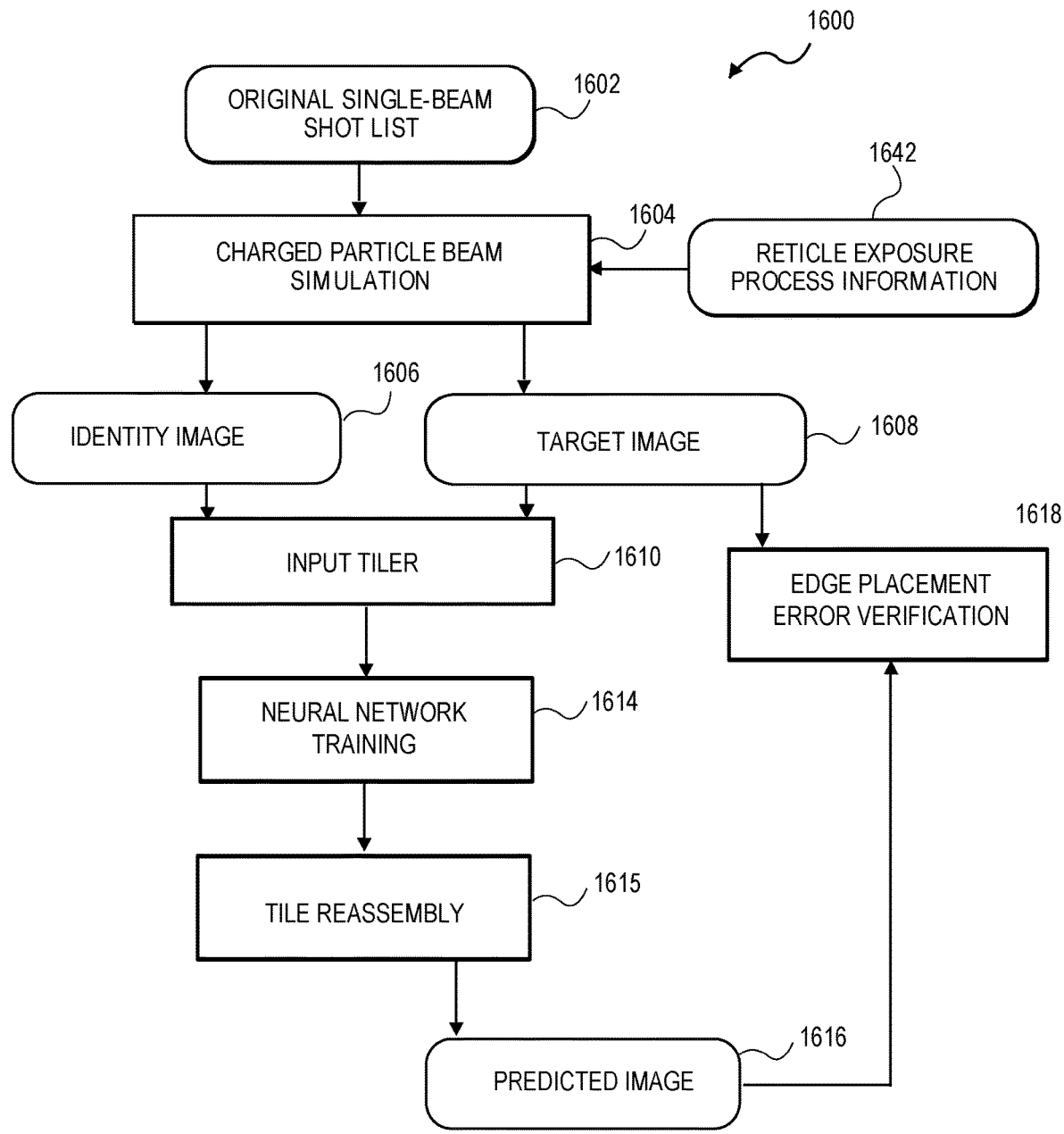
FIG. 16 illustrates a conceptual flow diagram of training a neural network to create a multi-beam shot list from a single-beam shot list, in accordance with some embodiments.

In training flow 1600 of FIG. 16, a set of single-beam charged particle beam shots is input as an original single-beam shot list 1602. The flow 1600 involves calculating a set of calculated images using the set of single-beam charged particle beam shots, and training a neural network with the set of calculated images. The training is performed using a computing hardware processor.

The calculating of a set of calculated images includes steps 1604 and 1610 of flow 1600 with inputs 1606, 1608. A charged particle beam simulation 1604 is performed on the shots in original single-beam shot list 1602 to produce an identity image 1606 and a target image 1608. The identity image 1606 and target image 1608 are the calculated pattern images that form a set of calculated images. The identity image is produced by rasterizing the single-beam shots on a grid including where shots overlap. Overlapped shots in the set of single-beam charged particle beam shots are handled by combining their dosages. Generation of the identity image does not include calculations for other exposure process information and is therefore quicker and simpler to produce than when including the other exposure process information. Reticle exposure process information 1642 may be simulated from the single-beam shots to include forward scattering, backward scattering, resist diffusion, Coulomb effect, fogging, loading and resist charging. Each target image 1608 in the set of calculated images contains reticle exposure process information 1642. While the same image from the single-beam shots is represented in both the identity and target images, only the target image 1608 contains these additional effects, and is generated similar to calculated pattern image 906 in FIG. 9 or calculated pattern information 1006 in FIG. 10. In some embodiments, each target image in the set of calculated comprises dose margin information.

The task of the neural network is to learn how to transform an identity image of the single-beam shots to a target image. The set of calculated images are used to train the neural network. Training of the neural network with the set of calculated images involves step 1614. In the training flow 1600 a target image 1608 and an identity image 1606 are divided into tiles in the input tiler 1610. An overlapping tile strategy is used such that the entire image is predicted part by part. The target image tiles include an overlap halo from adjacent tiles where the halos are overlapped to align the tiles, while the predicted image tiles abut with each other. The identity image tiles are input into a neural network 1614 to predict an image tile and compare it to a target tile in a loss calculation. A weighted bitmask is generated from a tile of the target image 1608 by generating a bitmask having the value of 1 representing the area within a target shape and 0 everywhere else. For a target image tile of size 336×336 (as a non-limiting example), the target shape is the core, such as a 256×256 core, which does not include the halo (e.g., 40 pixel halo). Additionally, to place emphasis on learning the contour of a shape an edge bitmask is generated from a tile of the target image 1608 by generating a contour of the target shape using a lower bound and an upper bound of a resist threshold. The weighted bitmask and the edge bitmask are then used in the loss calculation. The tiles are reassembled in step 1615 to produce a predicted image 1616 that matches the target image 1608.

The loss is calculated from the weighted bitmask, edge bitmask, learned hyperparameters α, β and an l2_loss. The l2_loss is a regression loss calculated from a mean squared error between the predicted image tile and the target image tile. Overall loss is then measured by the following formula:

$$Loss = \alpha * l2\_loss * weighted\_bitmask + \beta * l2\_loss * edge\_bitmask$$

In some embodiments, the training flow may include an additional verification step involving an edge placement error (EPE) verification 1618 where portions of the predicted image and the target image are overlaid and compared to each other.

Data preparation for neural network training 1614 may include cleaned target images where anomalies, e.g., small connected regions or thin bars below the resist threshold, have been removed. Data augmentation may include image flipping or transposing. In one example, shot lists of 100K nm×100K nm in size were divided into 10K nm×10K nm smaller shot lists and 80% were used for training while the remaining 20% were used for verification. The trained neural network may be used to convert an identity image generated from a set of single-beam shots to a predicted image.

Figure 17:
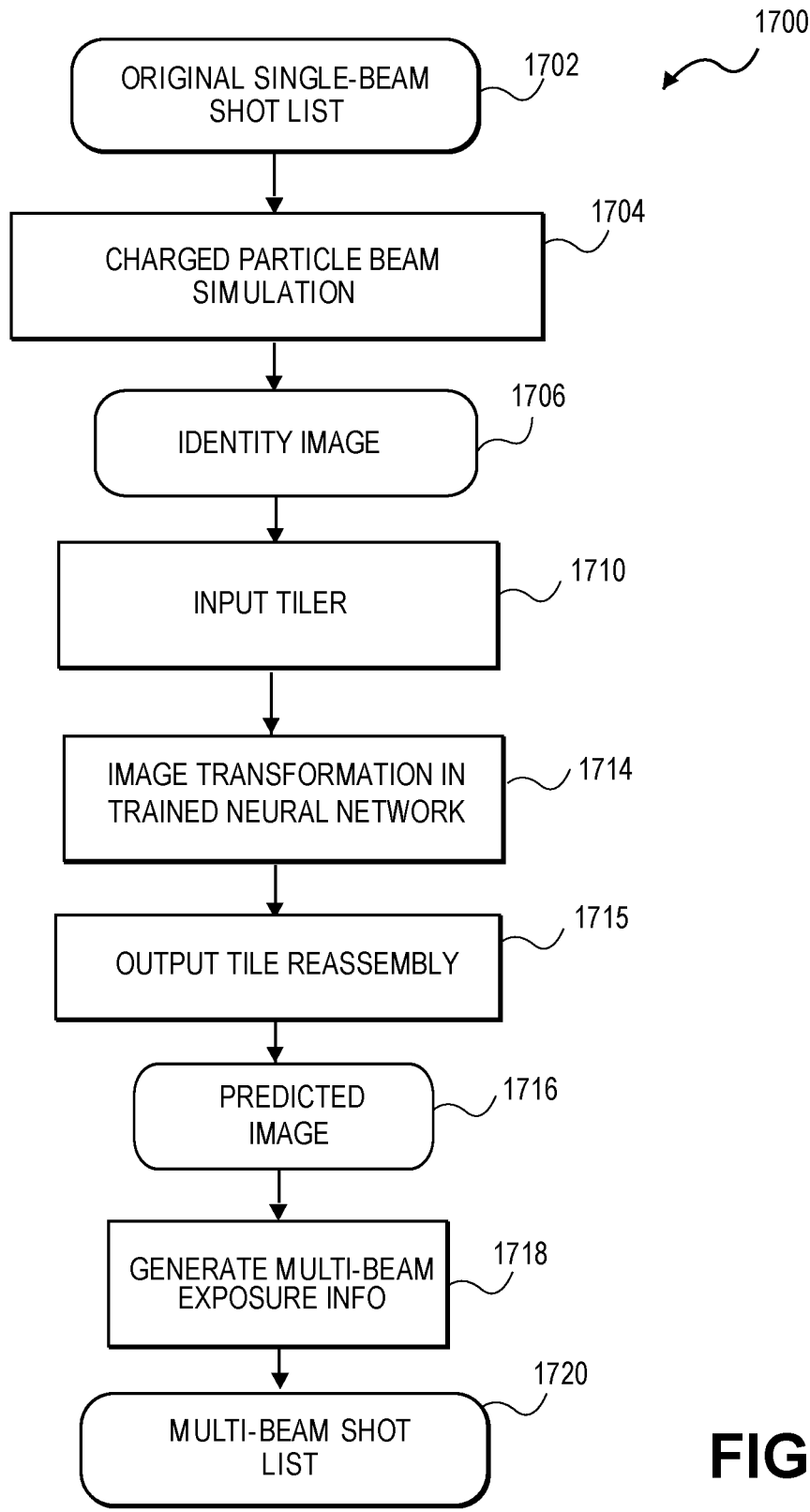
FIG. 17 illustrates a conceptual flow diagram of using a trained neural network to create a multi-beam shot list from a single-beam shot list, in accordance with some embodiments.

FIG. 17 describes an inferencing flow 1700 using the trained neural network 1614 resulting from training flow 1600 in FIG. 16. Once the neural network 1614 is trained with identity image 1606 and target image 1608 as shown in FIG. 16, it can be used to calculate a calculated image—that is, a predicted image 1716—from an identity image 1706 alone. The predicted image 1716 may represent an aerial image that will be formed on a surface.

The flow 1700 begins with inputting a set of single-beam shots 1702 which is a set of single-beam charged particle beam shots for forming a pattern on a surface using multi-beam charged particle beam lithography. In some embodiments, the shot list 1702 contains only VSB shots. The set of single-beam charged particle beam shots are used to calculate a calculated image, where the calculating includes a neural network (the trained neural network 1614 of FIG. 16). The pattern may include one or more patterns, and the calculated image may include contour information for the one or more patterns.

The calculating of a calculated image (predicted image 1716) includes steps 1704, 1710, 1714 and 1715 of flow 1700 with input 1706. First, the set of single-beam shots 1702 is input to a charged particle beam simulation system 1704 to produce the identity image 1706. The identity image is produced by rasterizing the single-beam shots on a grid including where shots overlap. Overlapped shots in the set of single-beam charged particle beam shots are handled by combining their dosages. Shots in the set of single-beam charged particle beam shots may have assigned dosages, or may have no assigned dosages. The identity image 1706 is divided into tiles in an input tiler 1710. The trained neural network 1714, which is the finalized neural network 1614 from the training flow FIG. 16, performs image transformation on each tile to create portions of the predicted image 1716. The tiles are reassembled in step 1715 to produce the predicted image 1716. A multi-beam shot list 1720 is then generated in step 1718 from the predicted image 1716. That is, step 1718 involves generating a set of multi-beam shots based on the calculated image (predicted image 1716), to convert the set of single-beam charged particle beam shots (shot list 1702) to the set of multi-beam shots 1720 which will produce a surface image on the surface. The multi-beam shot list 1720 is a set of multi-beam shots, where each multi-beam shot may include a plurality of beamlets. Generating the set of multi-beam shots may include determining pixel or beamlet dosage information for each of the patterns in the one or more patterns and generating the set of multi-beam shots from the pixel or beamlet dosage information for the one or more patterns.

Figure 18:
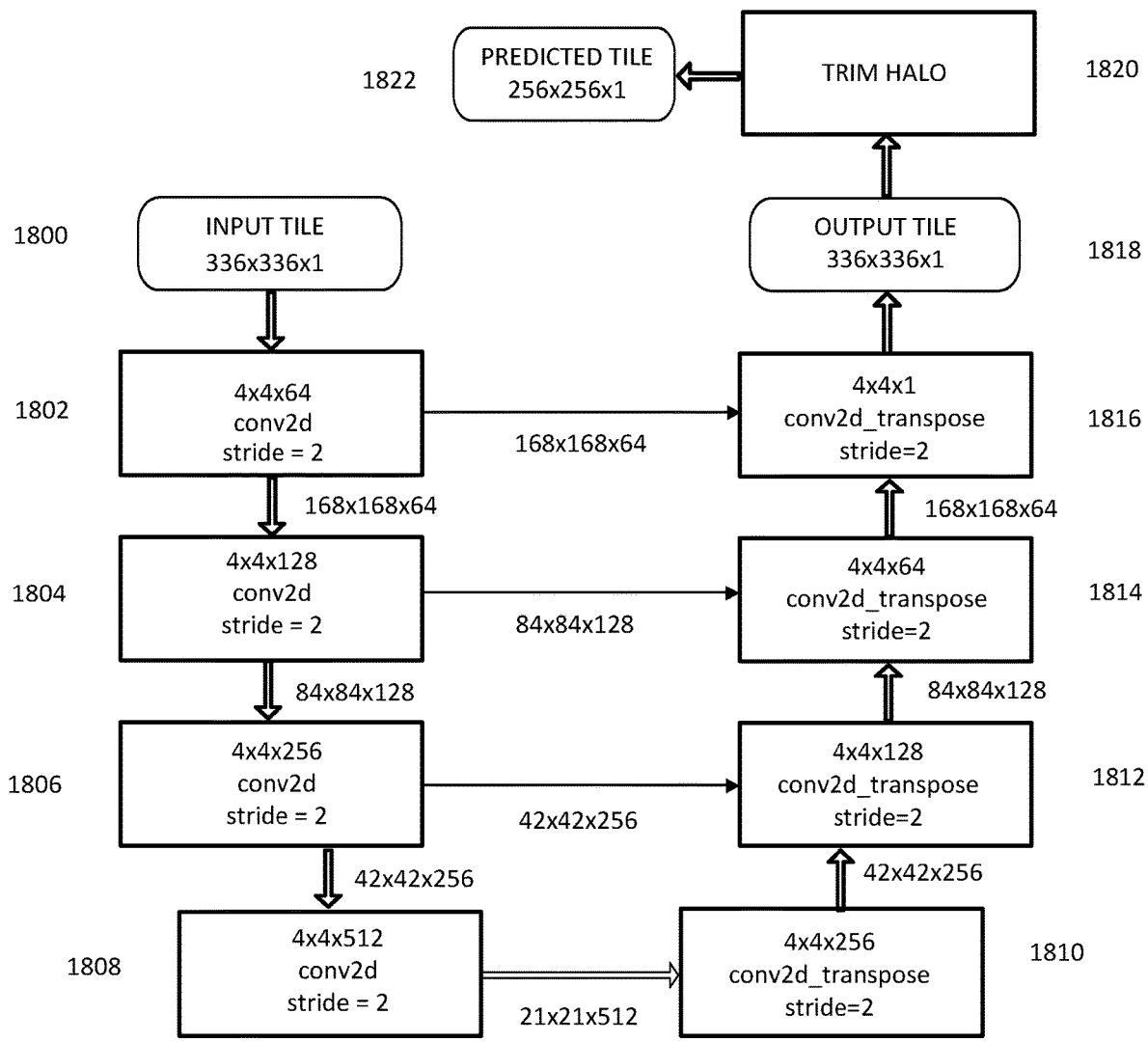
FIG. 18 illustrates details of a U-Net architecture, in accordance with some embodiments.

In some embodiments a U-Net architecture as shown in FIG. 18 may be used as the neural network 1614 of FIG. 16 and/or the neural network 1714 of FIG. 17. The values shown in the figure (e.g., 336×336×1) are used as an example scenario only; other values may be used in other embodiments. Conventionally, a U-Net may be trained for pixel-to-pixel classification. In contrast, in one embodiment, the U-Net may be trained for pixel-to-pixel conversion. When doing a pixel-to-pixel conversion, the softmax on the final layer's output is omitted. In one embodiment, the identity image input tile 1800 may be of size 336×336 pixels with one initial feature. The corresponding target image tile (not pictured) may be of size 256×256 pixels with a halo up to 40 pixels wide that reduces a checkerboard effect when assembling tiles. The target image tile is compared to the predicted image tile 1822. In the embodiment illustrated in FIG. 18, the tiles are processed through four convolution layers in a contracting network 1802, 1804, 1806 and 1808 followed by four more transposed convolution layers in an expansion network 1810, 1812, 1814 and 1816. Other numbers of convolution layers, such as less than four or more than four, may be used in other embodiments. The output tile 1818 of the final layer in the U-Net is a single channel feature map. Both contraction and expansion networks apply convolutions having a kernel size of, for example, 4×4 or 3×3, a stride of 2 and same padding to preserve size. The convolutions may be followed by a Batch Normalization layer and/or a Leaky ReLU layer in the contracting network and ReLU in the expanding network. The number of features may double in each layer (e.g., 64, 128, 256 and 512) in the contracting/downsampling network and may be halved in each layer in the expanding/upsampling network. In addition, in 1802, 1804 and 1806 each layer feature map output from the contracting network is concatenated with the corresponding layer feature map in the expansion network. A halo (e.g., 40 pixel wide) is trimmed from the output tile 1818 in step 1820 to produce the predicted tile 1822. One advantage of the U-Net architecture is that it does not require as many images to train as a conventional neural network. However, in other embodiments other types of neural networks suitable for image transformation may be used, for example Generative Adversarial Networks (GANs).

The fracturing, mask data preparation, and other flows described in this disclosure may be implemented using general-purpose computers with appropriate computer software as computation devices. Due to the large amount of calculations required, multiple computers or processor cores may also be used in parallel. In one embodiment, the computations may be subdivided into a plurality of 2-dimensional geometric regions for one or more computation-intensive steps in the flow, to support parallel processing. In another embodiment, a special-purpose hardware device, either used singly or in multiples, may be used to perform the computations of one or more steps with greater speed than using general-purpose computers or processor cores. In one embodiment, the special-purpose hardware device may be a graphics processing unit (GPU). In another embodiment, the optimization and simulation processes described in this disclosure may include iterative processes of revising and recalculating possible solutions, so as to minimize either the total number of shots, or the total charged particle beam writing time, or the difference between a calculated wafer image and a target wafer image, or MEEF, or CD variation, or some other parameter. In yet another embodiment, the wafer optimization may be performed in a correct-by-construction method, so that no iteration or further simulation are required.

Figure 12:
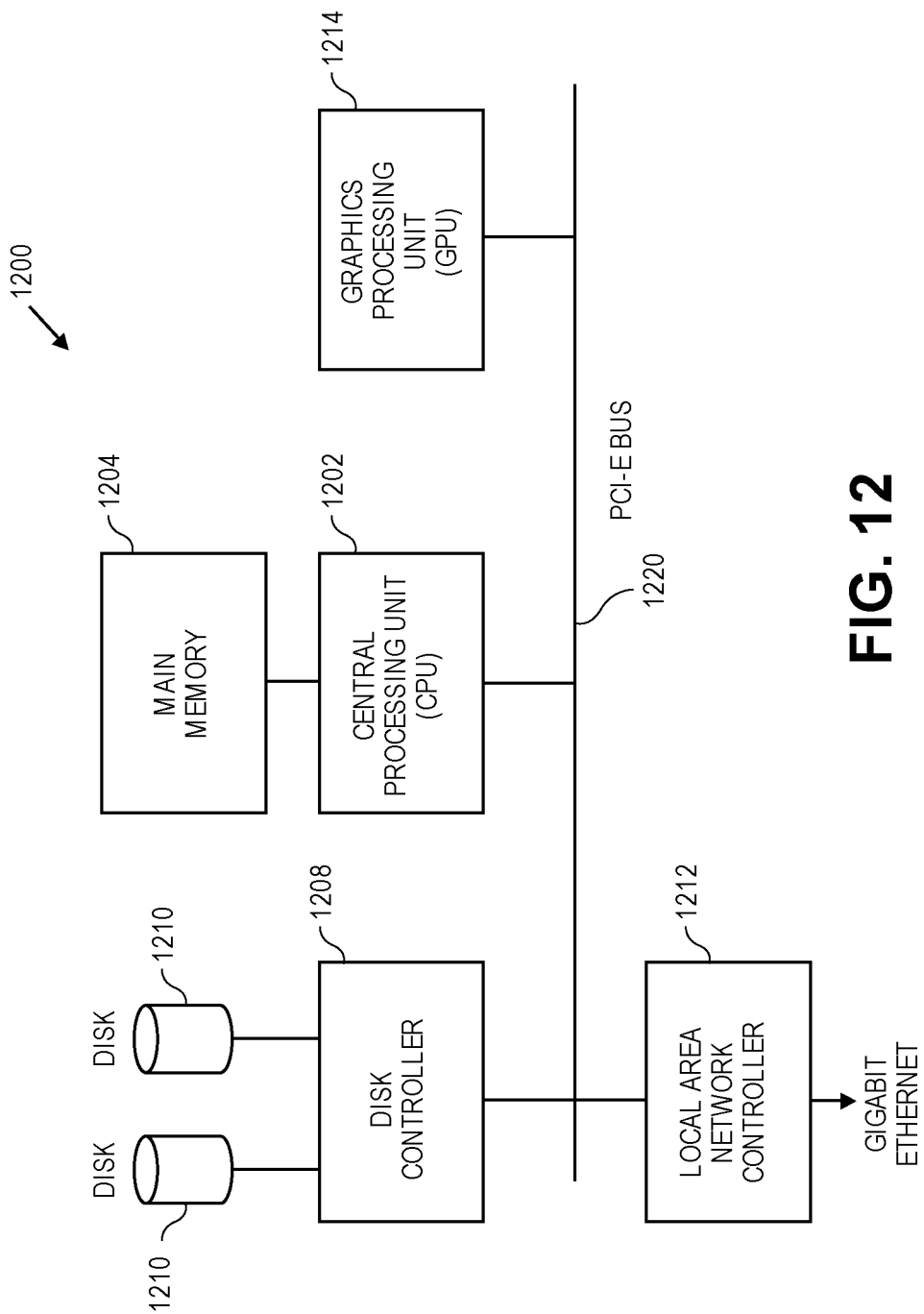
FIG. 12 illustrates an exemplary computing hardware device used in embodiments of the methods.

FIG. 12 illustrates an example of a computing hardware device 1200 that may be used to perform the calculations described in this disclosure. Computing hardware device 1200 comprises a central processing unit (CPU) 1202, with attached main memory 1204. The CPU may comprise, for example, eight processing cores, thereby enhancing performance of any parts of the computer software that are multi-threaded. The size of main memory 1204 may be, for example, 64 G-bytes. The CPU 1202 is connected to a Peripheral Component Interconnect Express (PCIe) bus 1220. A graphics processing unit (GPU) 1214 is also connected to the PCIe bus. In computing hardware device 1200 the GPU 1214 may or may not be connected to a graphics output device such as a video monitor. If not connected to a graphics output device, GPU 1214 may be used purely as a high-speed parallel computation engine. The computing software may obtain significantly-higher performance by using GPU 1214 for a portion of the calculations, compared to using CPU 1202 for all the calculations. The CPU 1202 communicates with the GPU 1214 via PCIe bus 1220. In other embodiments (not illustrated) GPU 1214 may be integrated with CPU 1202, rather than being connected to PCIe bus 1220. Disk controller 1208 may also be attached to the PCIe bus, with, for example, two disks 1210 connected to disk controller 1208. Finally, a local area network (LAN) controller 1212 may also be attached to the PCIe bus, and provides Gigabit Ethernet (GbE) connectivity to other computers. In some embodiments, the computer software and/or the design data are stored on disks 1210. In other embodiments, either the computer programs or the design data or both the computer programs and the design data may be accessed from other computers or file serving hardware via the GbE Ethernet.

While the specification has been described in detail with respect to specific embodiments, it will be appreciated that those skilled in the art, upon attaining an understanding of the foregoing, may readily conceive of alterations to, variations of, and equivalents to these embodiments. These and other modifications and variations to the present methods for fracturing, mask data preparation, forming a pattern on a reticle, training and inferencing with patterns in a neural network and manufacturing an integrated circuit may be practiced by those of ordinary skill in the art, without departing from the scope of the present subject matter, which is more particularly set forth in the appended claims. Furthermore, those of ordinary skill in the art will appreciate that the foregoing description is by way of example only, and is not intended to be limiting. Steps can be added to, taken from or modified from the steps in this specification without deviating from the scope of the invention. In general, any flowcharts presented are only intended to indicate one possible sequence of basic operations to achieve a function, and many variations are possible. Thus, it is intended that the present subject matter covers such modifications and variations as come within the scope of the appended claims and their equivalents.

What is claimed is:

1. A method for forming a pattern on a surface using multi-beam charged particle beam lithography, the method comprising:
    inputting a set of single-beam charged particle beam shots;
    calculating a calculated image using the set of single-beam charged particle beam shots, wherein the calculating comprises pixel-to-pixel conversion using a neural network, wherein the neural network comprises a U-Net;
    generating a set of multi-beam shots based on the calculated image, to convert the set of single-beam charged particle beam shots to the set of multi-beam shots which will produce a surface image on the surface, wherein the surface image matches the calculated image, within a pre-determined tolerance, and wherein the generating is performed using a computing hardware processor; and
    forming the pattern on the surface using the set of multi-beam shots.

2. The method of claim 1 wherein the pattern comprises one or more patterns, and wherein the calculated image comprises contour information for the one or more patterns.

3. The method of claim 1 wherein the calculated image comprises a predicted image calculated by the neural network.

4. The method of claim 3 wherein the predicted image comprises an aerial image.

5. The method of claim 1 wherein each multi-beam shot comprises a plurality of beamlets.

6. The method of claim 1 wherein shots in the set of single-beam charged particle beam shots comprise assigned dosages.

7. The method of claim 1 wherein shots in the set of single-beam charged particle beam shots have no assigned dosages.

8. The method of claim 1 wherein shots in the set of single-beam charged particle beam shots overlap.

9. The method of claim 1 wherein shots in the set of single-beam charged particle beam shots comprise variable shaped beam (VSB) shots.

10. The method of claim 1 wherein the pattern comprises one or more patterns, wherein the multi-beam charged particle beam lithography comprises exposing a plurality of pixels or beamlets, and wherein the step of generating comprises:
    determining pixel or beamlet dosage information for each of the patterns in the one or more patterns; and
    generating the set of multi-beam shots from the pixel or beamlet dosage information for the one or more patterns.

11. The method of claim 1 wherein the calculating further comprises calculating an identity image from the set of single-beam charged particle beam shots.

12. The method of claim 11 wherein the identity image is divided into tiles.

13. The method of claim 1 wherein the U-Net further comprises four convolution layers in a contracting network and four transposed convolution layers in an expansion network.

14. The method of claim 13 wherein a stride of 2 and a kernel size of 4×4 is used in each of the four convolution layers in the contracting network and in each of the four transposed convolution layers in the expansion network.

* * * * *